(12) United States Patent
Kanai et al.

(10) Patent No.: US 12,414,415 B2
(45) Date of Patent: Sep. 9, 2025

(54) SURFACE-EMITTING DEVICE WITH A LIGHT EMITTING DIODE AND A SEALING MEMBER

(71) Applicant: DAI NIPPON PRINTING CO., LTD., Tokyo-to (JP)

(72) Inventors: Yoshihiro Kanai, Tokyo-to (JP); Atsuo Tsuzuki, Tokyo-to (JP); Marii Nishikawa, Tokyo-to (JP); Kosuke Saeki, Tokyo-to (JP); Shunsuke Furuya, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 18/727,541

(22) PCT Filed: Jan. 11, 2023

(86) PCT No.: PCT/JP2023/000407
§ 371 (c)(1),
(2) Date: Jul. 9, 2024

(87) PCT Pub. No.: WO2023/136256
PCT Pub. Date: Jul. 20, 2023

(65) Prior Publication Data
US 2025/0081687 A1    Mar. 6, 2025

(30) Foreign Application Priority Data
Jan. 12, 2022  (JP) .................................. 2022-003216

(51) Int. Cl.
*H01L 33/56*   (2010.01)
*G02F 1/13357*   (2006.01)
(Continued)

(52) U.S. Cl.
CPC ...... *H10H 20/854* (2025.01); *G02F 1/133603* (2013.01); *G02F 1/133606* (2013.01); *H01L 25/0753* (2013.01)

(58) Field of Classification Search
CPC ............ H10H 20/854; G02F 1/133603; G02F 1/133606; H01L 25/0753
See application file for complete search history.

(56) References Cited

U.S. PATENT DOCUMENTS

| | | |
|---|---|---|
| 2013/0001605 A1 | 1/2013 | Ishihara et al. |
| 2014/0160765 A1 | 6/2014 | Sato et al. |

(Continued)

FOREIGN PATENT DOCUMENTS

| | | |
|---|---|---|
| CA | 2842148 A1 | 1/2013 |
| JP | 2003-046105 A | 2/2003 |

(Continued)

OTHER PUBLICATIONS

Machine Translation JP2016-255374 (Year: 2016).*

(Continued)

*Primary Examiner* — Tracie Y Green
(74) *Attorney, Agent, or Firm* — Oliff PLC

(57) ABSTRACT

A surface-emitting device includes: a light-emitting diode substrate including a supporting substrate, and a light-emitting diode element placed on one surface side of the supporting substrate; and a sealing member placed on a light-emitting diode element side surface of the light-emitting diode substrate, and configured to seal the light-emitting diode element; wherein the light-emitting diode element includes a transparent substrate including inorganic material, and a light-emitting layer formed on one surface of the transparent substrate; the light-emitting diode element is a bare chip in which the transparent substrate is exposed on a surface thereof; the sealing member is in contact with the (Continued)

transparent substrate on a side surface and a surface opposite side to a surface where the light-emitting layer is formed; and a haze value of the sealing member is 4% or more, and a thickness thereof is thicker than a thickness of the light-emitting diode element.

7 Claims, 10 Drawing Sheets

(51) Int. Cl.
*H01L 25/075* (2006.01)
*H10H 20/854* (2025.01)

(56) References Cited

U.S. PATENT DOCUMENTS

| | | | |
|---|---|---|---|
| 2020/0357847 | A1 | 11/2020 | Watanabe et al. |
| 2023/0378403 | A1* | 11/2023 | Arihara ................. B32B 27/00 |

FOREIGN PATENT DOCUMENTS

| | | |
|---|---|---|
| JP | 2008-200861 A | 9/2008 |
| JP | 2013-016588 A | 1/2013 |
| JP | 2014-521227 A | 8/2014 |
| JP | 2016-225374 A | 12/2016 |
| JP | 2018-050027 A | 3/2018 |
| JP | 2020-188073 A | 11/2020 |
| JP | 2021-009937 A | 1/2021 |
| WO | 2013/018902 A1 | 2/2013 |

OTHER PUBLICATIONS

Machine Translation JP2021-00937 (Year: 2021).*
Machine Translation of Written Opnion PCT-JP2023-000407 (Year: 2023).*

* cited by examiner

SURFACE-EMITTING DEVICE WITH A LIGHT EMITTING DIODE AND A SEALING MEMBER

TECHNICAL FIELD

The present disclosure relates to a surface-emitting device, and a display device using the same.

BACKGROUND ART

Recently, in the field of a display device, higher definition display has been required. The display device using light-emitting diode element has been attracting attention since it has advantages such as high luminance and high contrast, and the development thereof is in progress. For example, as a backlight used for a liquid crystal display device, the development of a backlight using a light-emitting diode element is in progress. The backlight is also referred to as a mini-LED backlight. (In the following descriptions, "light-emitting diode" may be referred to as "LED" in the explanations.)

Here, the LED backlight is roughly classified into a downlight type system and an edge light type system. For a small or medium sized display device such as a mobile terminal such as a smartphone, an edge light system LED backlight is usually used in many cases. However, from the viewpoint of brightness, for example, it has been studied to use a downlight type system LED backlight. Meanwhile, in a large display device such as a large screen liquid crystal television, the downlight type system LED backlight is used in many cases.

The downlight type system LED backlight has a configuration wherein a plurality of LED elements are placed on a substrate. In such a downlight type system LED backlight, by independently controlling a plurality of LED elements, it is possible to realize so-called local dimming wherein the brightness of each region of the LED backlight is adjusted according to the brightness and darkness of display graphic. Thereby, it is possible to achieve a large improvement of contrast and low power consumption of the display device.

CITATION LIST

Patent Document

Patent Document 1: WO2013/018902

SUMMARY OF DISCLOSURE

Technical Problem

In surface-emitting devices such as the downlight type system LED backlight, in view of suppressing a luminance unevenness, for example, a diffusion plate or a transmission reflector (hereinafter, a diffusion member) is placed on the upper side of the LED element. In order to suppress the luminance unevenness, it is necessary to place the LED element and the diffusion member apart. Therefore, in order to maintain a predetermined gap between the LED element and the diffusion member, pins or spacers are conventionally placed (for example, Patent Document 1). FIG. 12A is a conventional LED backlight 60 wherein pins 65 are placed in order to secure distance "d" between a LED element 63 on a supporting substrate 62 and a diffusion member 66. FIG. 12B1 is a conventional LED backlight 61 wherein spacers 67 are placed between the supporting substrate 62 and the diffusion member 66, and FIG. 12B2 is a schematic plan view of the spacers 67.

Also, for the LED elements used in the LED backlight, so-called bare chip (hereinafter may be referred to as a LED bare chip), wherein the LED element itself is not protected by sealing materials, may be used for higher definition display and further, to make the display device itself thinner.

In this way, when the LED bare chip is used as a LED element, there is a problem that the light extraction efficiency of the LED element is not improved much when the pins or spacers are arranged as described above.

The present disclosure has been made in view of the above circumstances, and a main object thereof is to provide a surface-emitting device having high light extraction efficiency, although a LED bare chip is used.

Solution to Problem

In order to solve the problems, the inventors of the present disclosure have carried out intensive studies, and found out that the decrease in the light extraction efficiency in the bare chip is due to the following reasons, and thereby, have achieved the present invention. That is, since the refractive index of the transparent substrate such as sapphire used for the bare chip is relatively high, the refractive index difference between the transparent substrate and surrounding air is large, as the result, the reflectance of the light emitted from the light-emitting layer reflected on the interface of the transparent substrate and the surrounding air is high, so that the light extraction efficiency is decreased.

That is, the present disclosure provides a surface-emitting device comprising: a light-emitting diode substrate including a supporting substrate, and a light-emitting diode element placed on one surface side of the supporting substrate; and a sealing member placed on a light-emitting diode element side surface of the light-emitting diode substrate, and configured to seal the light-emitting diode element; wherein the light-emitting diode element includes a transparent substrate including inorganic material, and a light-emitting layer formed on one surface of the transparent substrate; the light-emitting diode element is a bare chip in which the transparent substrate is exposed on a surface thereof; the sealing member is in contact with the transparent substrate on a side surface and a surface opposite side to a surface where the light-emitting layer is formed; and a haze value of the sealing member is 4% or more, and a thickness thereof is thicker than a thickness of the light-emitting diode element.

Also, the present disclosure provides a display device comprising a display panel; and the surface-emitting device described above placed on a rear surface of the display panel.

Advantageous Effects of Disclosure

The present disclosure has an effect that, in a surface-emitting device used for a display device, for example, it is able to provide a surface-emitting device having high light extraction efficiency, although a LED bare chip is used.

BRIEF DESCRIPTION OF DRAWINGS

FIGS. 12A to 12B2 are schematic cross-sectional views of a conventional LED backlight.

DESCRIPTION OF EMBODIMENTS

Embodiments in the present disclosure are hereinafter explained with reference to, for example, drawings. However, the present disclosure is enforceable in a variety of different forms, and thus should not be taken as is limited to the contents described in the embodiments exemplified as below. Also, the drawings may show the features of the invention such as width, thickness, and shape of each member schematically comparing to the actual form in order to explain the invention more clearly in some cases; however, it is merely an example, and thus does not limit the interpretation of the present disclosure. Also, in the present descriptions and each drawing, for the factor same as that described in the figure already explained, the same reference sign is indicated and the detailed explanation thereof may be omitted.

In the present descriptions, on the occasion of expressing an aspect wherein some member is placed on the other member, when described as merely "on the surface side", unless otherwise stated, it includes both of the following cases: a case wherein some member is placed directly on or directly below the other member so as to be in contact with the other member, and a case wherein some member is placed on the upper side or the lower side of the other member via yet another member.

Also, the terms such as "sheet", "film" and "plate" in the present specification are not distinguished from each other based only on the difference in naming. For example, the term "sheet" is used to mean that it also includes a material called a film or a plate.

A surface-emitting device, and a display device using the same in the present disclosure will be hereinafter described in detail.

A. Surface-Emitting Device

The surface-emitting device in the present disclosure comprises: a light-emitting diode substrate including a supporting substrate, and a light-emitting diode element placed on one surface side of the supporting substrate; and a sealing member placed on a light-emitting diode element side surface of the light-emitting diode substrate, and configured to seal the light-emitting diode element; wherein the light-emitting diode element includes a transparent substrate including inorganic material, and a light-emitting layer formed on one surface of the transparent substrate; the light-emitting diode element is a bare chip in which the transparent substrate is exposed on a surface thereof; the sealing member is in contact with the transparent substrate on a side surface and a surface opposite side to a surface where the light-emitting layer is formed; and a haze value of the sealing member is 4% or more, and a thickness thereof is thicker than a thickness of the light-emitting diode element.

Figure 1:
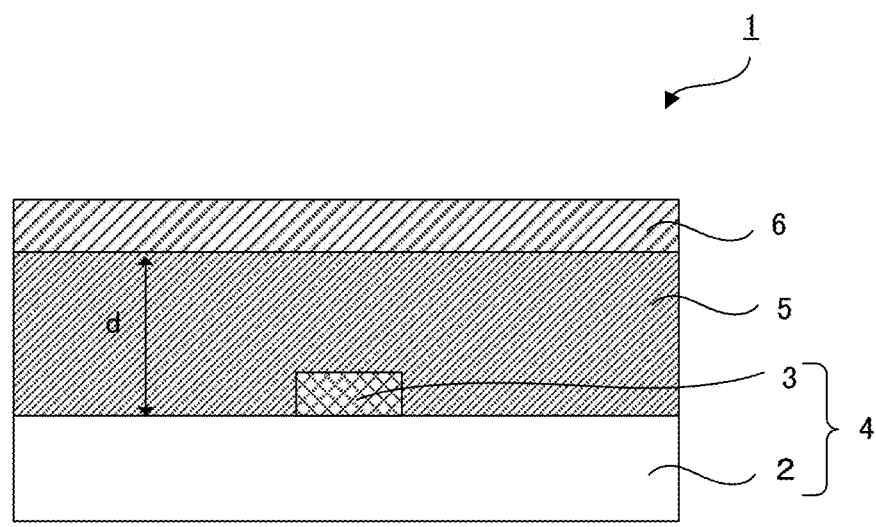
FIG. 1 is a schematic cross-sectional view illustrating an example of a surface-emitting device in the present disclosure.

FIG. 1 is a schematic cross-sectional view illustrating an example of a surface-emitting device in the present disclosure. As shown in FIG. 1, a surface-emitting device 1 comprises a LED substrate 4 including a supporting substrate 2, and a LED bare chip 3 placed on one surface side of the supporting substrate 2; a sealing member 5 placed on the LED bare chip 3 side surface of the LED substrate 4, and configured to seal the LED element 3; and a diffusion member 6 placed on the sealing member 5, on the surface side opposite to the LED substrate 4 side. The haze value of the sealing member 5 in the present disclosure is 4% or more, and a thickness "d" thereof is thicker than the thickness of the LED element 3.

Figure 2:
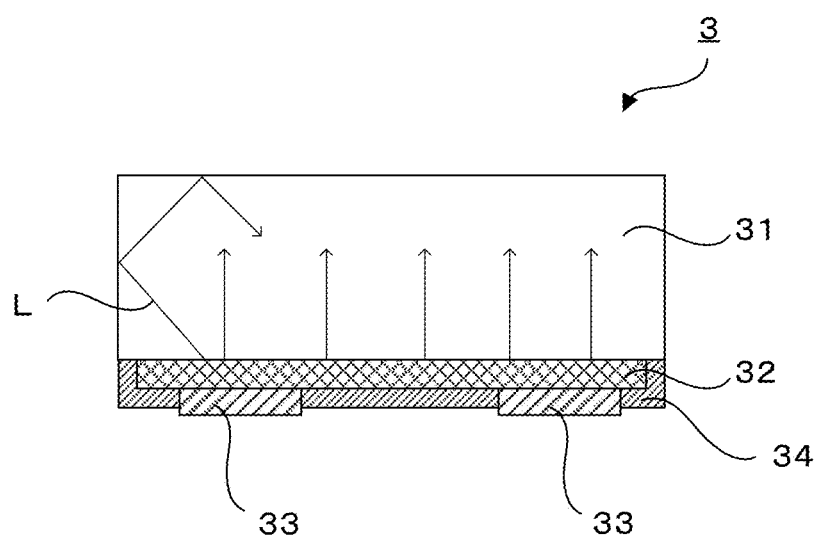
FIG. 2 is a schematic cross-sectional view illustrating an example of a LED bare chip in the present disclosure.

As shown in FIG. 2, the LED bare chip 3 includes a transparent substrate 31 including sapphire, for example; a light-emitting layer 32 formed on the transparent substrate 31; electrodes 33 and 33 configured to energize the light-emitting layer; and a passivation layer 34 configured to protect the light-emitting layer 33.

As shown in FIG. 1 and FIG. 2, the sealing member 5 is formed so that it is in contact with the transparent substrate 31 on a side surface and a surface opposite to a surface where the light-emitting layer 32 is formed.

As described above, when a LED bare chip is used as a LED element in a conventional surface-emitting device, the side surface and the top surface of the LED bare chip are in contact with air. In this case, as shown in FIG. 2, light L emitted from the emitting layer 32 is reflected on the side surface of the transparent substrate 31 including sapphire, for example, depending on the direction of emission from the emitting layer 32, it may be further reflected on the top surface of the transparent substrate 31, and eventually absorbed in the light-emitting surface of the light-emitting layer 32. For this reason, in such surface-emitting devices, there may be a problem in the light extraction efficiency from the LED bare chip.

In the present disclosure, by placing the sealing member 5 so as to be in contact with the transparent substrate 31, on the surface opposite to the surface where the light-emitting layer 32 is formed, that is, with the top surface; and the side surface of the transparent substrate 31, the refractive index difference with respect to the constituent material of the transparent substrate 31 is decreased, compared with the case where the transparent substrate 31 is in contact with air. As the result, it is possible to reduce the reflectance of light L emitted from the light-emitting layer 32 and reflected on the top surface and side surface of the transparent substrate 31 so that the amount of light L absorbed by the transparent substrate 31 and the light-emitting layer 32 and so on, as the result of being reflected repeatedly, may be reduced. As the result, in the surface-emitting device in the present disclosure, an effect that the light extraction efficiency from the light-emitting layer 32 may be improved, is obtained.

Hereinafter, each constitution of the surface-emitting device in the present disclosure is explained.

1. LED Substrate

The LED substrate in the present disclosure is a member including a supporting substrate, and a plurality of LED elements placed on one surface of the supporting substrate. In the present disclosure, the LED element include a transparent substrate including inorganic material, and a light-emitting layer formed on one surface of the transparent substrate, and it is a bare chip (hereinafter may be referred to as a LED bare chip) in which the transparent substrate is exposed on the surface thereof.

(1) LED Bare Chip

The LED bare chip used in the present disclosure is a member placed on one surface of the supporting substrate, and functions as a light source. Examples of such an LED bare chip may include the one shown in FIG. 2 described above, and it includes at least a transparent substrate and a light-emitting layer, and usually includes an electrode configured to energize the light-emitting layer. The light emitted by the light-emitting layer is emitted externally via the transparent substrate.

a) Transparent Substrate

The transparent substrate used for the LED bare chip is usually not particularly limited as long as it includes inorganic material, and those capable of growing crystals of the material included in the light-emitting layer described later are preferable, and specific examples may include sapphire ($Al_2O_3$), silicon carbide, and silicon. Among them, sapphire is preferably used.

The lower limit of the refractive index of the transparent substrates used in the present disclosure is usually 1.4 or more, and preferably 1.5 or more. Meanwhile, the upper limit of the refractive index of the transparent substrate is usually 2.5 or less, and preferably 2.0 or less. This is because the problem described above arises when the material having the refractive index in the above range is included in the transparent substrate.

The refractive index of the transparent substrate may be measured by an Abbe refractometer.

The shape of the transparent substrate is usually a rectangular or cylindrical shape, and the surface on the side where the light-emitting layer is not formed may be a shape that reduces the reflectance.

The surface of the transparent substrate on opposite side to the surface where the light-emitting layer is formed (may be referred to as a top surface), and the side surface of the transparent substrate in the present disclosure are in contact with the sealing member described later. As described above, by placing so as to be in contact with the sealing member as described above, it is possible to reduce the reflectance of light emitted from the light-emitting layer and reflected on the interface of the transparent substrate so that the light extraction efficiency of the light transmitted from the light-emitting layer may be improved.

Here, the top surface of the transparent substrate and the sealing member are preferably in contact with the entire surface. Also, it is not particularly limited as long as the side surface of the transparent substrate and the sealing member are in contact with each other, and they are preferably in contact with 90% or more of the area of the side surface, and particularly preferably in contact with 99% or more of the area.

The proportion of the area where the transparent substrate is in contact with the sealing member, that is, the coverage by the sealing member, is measured by the following method.

Firstly, 10 LED bare chips covered with the sealing member are cut out from the surface-emitting device. Then, the LED bare chip covered with the sealing member is cut using a microtome. The transparent substrate of the cut LED bare chip is observed with a scanning electron microscope (SEM) to determine the coverage by the sealing member. The average value of the determined coverage is regarded as the proportion of the area where the transparent substrate is in contact with the sealing member.

b) Light-Emitting Layer

The light-emitting layer used in the LED bare chip is usually not particularly limited as long as it is material used for the LED bare chip; and examples thereof may include gallium nitride, indium gallium nitride, gallium aluminum nitride, aluminum gallium arsenide, gallium arsenic phosphorus, gallium phosphorus, zinc selenide and aluminum gallium phosphate indium.

When the LED bare chip is used as an aspect of the LED element as described in the present disclosure, for example, a blue light-emitting layer, an ultraviolet light-emitting layer, or an infrared light-emitting layer may be used as the light-emitting layer. By using thereof in combination with a wavelength conversion member, white light may be emitted.

In the present disclosure, a blue light-emitting layer, or an ultraviolet light-emitting layer is preferable. As for the blue light-emitting layer, white light may be produced, for example, by combining with a yellow fluorescent substance; or by combining with a red fluorescent substance and a green fluorescent substance. Also, as for the ultraviolet light-emitting layer, for example white light may be produced, for example by combining with a red fluorescent substance, a green fluorescent substance, and a blue fluorescent substance.

Among them, in the present disclosure, the light-emitting layer of the LED bare chip is preferably a blue light-emitting layer. The reason therefor is to be enable to irradiate a high luminance white light, in the surface-emitting device in the present disclosure.

c) Others

In addition to the above, electrodes, protective layers (passivation layers), for example, are usually placed in the LED bare chip.

The LED bare chip is usually placed on one surface of the supporting substrate described later, at an equal interval. As for the arrangement of the LED bare chip, the transparent substrate is placed so that it is on the opposite side to the supporting substrate. That is, the supporting substrate, the electrode if necessary, the light-emitting layer and the transparent substrate are placed in this order.

The size or arrangement density of the LED bare chip is appropriately selected according to the use application and size of the surface-emitting device in the present disclosure.

As for the specific size of the LED bare chip when the LED bare chip has a rectangular shape, the lower limit of the length of one side is preferably 0.01 mm or more, more preferably 0.05 mm or more, and further preferably 0.1 mm or more. Meanwhile, the upper limit of the length of one side is preferably 2 mm or less, more preferably 1 mm or less, and further preferably 0.5 mm or less. Incidentally, when the LED bare chip has a circular, elliptical, or polygonal shape, for example, its maximum diameter is preferably in the above range.

When the size of the LED bare chip is small, the LED bare chip may be placed at high density, that is, the interval (pitch) between the LED bare chips may be reduced, so that the distance between the LED substrate and diffusion member may be shortened. That is, the thickness of the sealing member may be reduced. Thereby, reduction of the thickness and reduction of the weight may be realized.

(2) Supporting Substrate

The supporting substrate used in the present disclosure is a member configured to support, for example, the LED bare chip, the sealing member, and the diffusion member described above.

The supporting substrate may be transparent, and may be opaque. Also, the supporting substrate may be flexible, and may be rigid. The supporting substrate may be flexible and rigid. The material of the supporting substrate may be an organic material, may be an inorganic material, and may be a composite material obtained by compounding both of an organic material and an inorganic material.

When the material of the supporting substrate is an organic material, a resin substrate may be used as the supporting substrate. Meanwhile, when the material of the supporting substrate is an inorganic material, a ceramic substrate, and a glass substrate may be used as the supporting substrate. Also, when the material of the supporting substrate is a composite material, a glass-epoxy substrate may be used as the supporting substrate. Also, for example, a metal core substrate may also be used as the supporting substrate. A printed circuit substrate on which a circuit is formed by printing, may also be used as the supporting substrate.

The thickness of the supporting substrate is not particularly limited, and is appropriately selected according to the presence or absence of the flexibility or rigidity, and the use application and size, for example, of the surface-emitting device in the present disclosure.

(3) Others

The LED substrate in the present disclosure is not particularly limited as long as it includes the supporting substrate and the LED bare chip described above, and may have a required configuration as appropriate. Examples of such configuration may include a wiring portion, a terminal portion, an insulating layer, reflective layer, and a heat radiating member. Each configuration may be similar to those used for a known LED substrate.

The wiring portion is electrically connected to the LED bare chip. The wiring portion is usually placed in a pattern form. Also, the wiring portion may be placed on the supporting substrate via an adhesive layer. As the material of the wiring portion, for example, a metal material, and a conductive polymer material may be used.

The wiring portion is electrically connected by a joining portion corresponding to the electrode of the LED bare chip. As the material of the joining portion, for example, a joining agent including a conductive material such as a metal and a conductive polymer, and a solder may be used.

A reflective layer may be placed on the surface of the supporting substrate on which the LED bare chip is placed, in a region other than the LED bare chip mounting region. For example, the light reflected by the second layer of the diffusion member described above may be reflected by the reflective layer of the supporting substrate, and may be entered again into the first layer of the diffusion member, to increase the utilization efficiency of the light.

The reflective layer may be similar to a reflective layer commonly used for a LED substrate. Specifically, examples of the reflective layer may include a white resin film including metal particles, inorganic particles or pigments, and a resin; a metal film; and a porous film. The thickness of the reflective layer is not particularly limited as long as it is a thickness by which a desired reflectance may be obtained, and is appropriately set. The method for forming the LED substrate may be similar to a known method for forming.

2. Sealing Member

The haze value of the sealing member in the present disclosure is 4% or more, and the thickness thereof is thicker than the thickness of the LED element. The sealing member has a light transmittivity, and is placed on the light-emitting surface side of the LED substrate.

(1) Properties of Sealing Member (a) Haze Value

The haze value of the sealing member in the present disclosure is 4% or more, preferably 8% or more, further preferably 10% or more, and particularly preferably 12% or more. By setting the haze value in the above range, the heat resistance of the sealing member with respect to the heat generation, for example, of the LED may be improved. Also, when the haze value is lower than the above value, luminance unevenness may not be suppressed. Meanwhile, although the upper limit is not particularly limited, and is, for example, 85% or less, preferably 60% or less, and further preferably 30% or less. By setting the haze value in the above range, the loss of light in the sealing member is less likely to occur.

In the present descriptions, the haze value is a value as a whole sealing member, and may be obtained by cutting out the sealing member from the surface-emitting device, and measuring thereof by a method according to JIS K7136: 2000, with a haze meter (HM-150 from Murakami Color Research Laboratory Co., Ltd.).

A method for adjusting the haze value to obtain the haze value described above is not particularly limited, and examples thereof may include a method wherein the difference in crystallinity degrees of the resins is utilized; and a method wherein the fine particle content in the resins are varied. Among the above, a method wherein the crystallinity degrees of the resins are adjusted, is preferable. When the haze value is increased by increasing the crystallinity degree of the resin, an effect of decreasing straight advancing transmitting light may be obtained.

(b) Thickness

The thickness of the sealing member in the present disclosure may be any thickness thicker than the LED element. Specifically, the thickness is preferably 50 μm or more, more preferably 80 μm or more, and particularly preferably 200 μm or more.

Meanwhile, the thickness of the sealing member is preferably 800 μm or less, more preferably 750 μm or less, and particularly preferably 700 μm or less.

Incidentally, the "thickness" in the present descriptions may be measured using a known measurement method capable of measuring a μm-order size. Specifically, a contact type film thickness measuring device (Thickness Gage 547-301 from Mitutoyo Corporation) may be used. The same applies to the measurement of the dimension such as "size".

When the thickness is thinner than the above range, the thickness is not sufficient so that the light emitted from the LED element cannot be diffused throughout the whole light emitting surface, and the in-plane uniformity of luminance may not be improved. Also, when the thickness is thicker than the above range, the reduction in thickness may not be realized.

(c) Refractive Index

The refractive index of the sealing member in the present disclosure is preferably close to the refractive index of the transparent substrate of the LED bare chip. Specifically, the lower limit of the refractive index is preferably 1.1 or more, more preferably 1.2 or more, and particularly preferably 1.4 or more. Meanwhile, the upper limit of the refractive index is preferably 2.5 or less, more preferably 2.5 or less, and particularly preferably 1.8 or less.

Incidentally, since the method for measuring a refractive index may be similar to those described in the section of the transparent substrate above, the explanation is omitted herein.

(d) Total Light Transmittance

The total light transmittance of the sealing member in the present disclosure is not particularly limited as long as it is able to function as a surface-emitting device, and is preferably 70% or more, and more preferably 80% or more. Incidentally, the total light transmittance of the sealing member may be measured by, for example, a method according to JIS K7361-1:1997.

(2) Material of Sealing Member

The material included in the sealing member in the present disclosure is not particularly limited as long as it is material capable of realizing the haze value described above, and a thermoplastic resin is preferable. By using the thermoplastic resin, for example, the haze value may be adjusted to be high compared to a case wherein a thermosetting resin is used, and further, the sealing member may be formed at low temperature.

Figure 3A:
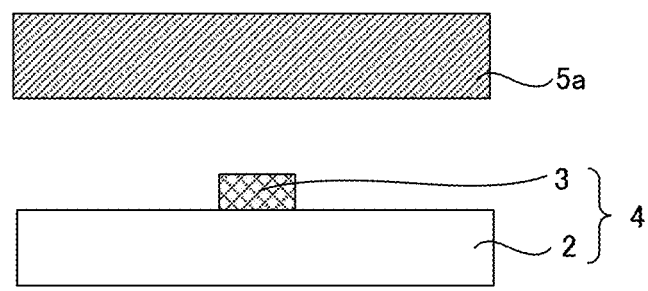
FIGS. 3A and 3B are process diagrams illustrating an example of a method for forming a sealing member in the present disclosure.
Figure 3B:
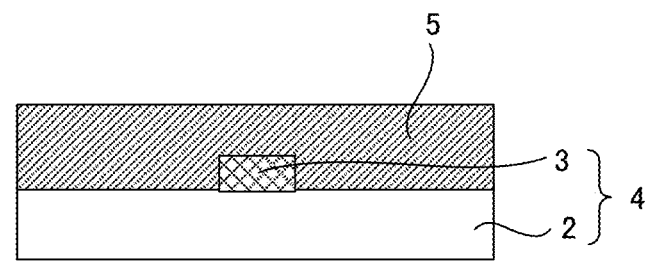

Also, when the sealing member includes a thermoplastic resin, a sheet shaped sealing member (hereinafter, it may be referred to as a sealing member sheet in some cases) including a sealing material composition containing a thermoplastic resin, may be used. FIGS. 3A and 3B are process diagrams illustrating an example of a method for forming a sealing member in the present disclosure. As shown in FIG. 3A for example, a LED substrate 4 and a sealing member sheet 5a on one surface thereof are prepared; the sealing member sheet 5a is stacked on the LED element 3 side surface of the LED substrate 4; and then, the sealing member sheet 5a is compression bonded to the LED substrate 4 using, for example, a vacuum lamination method. Thereby, as shown in FIG. 3B, a sealing member 5 sealing the LED element 3 may be formed.

Thereby, the sealing member 5 may be in closely contact with the top surface and the side surface of the transparent substrate of the LED element (LED bare chip) 3.

When the sealing member includes a curable resin such as a thermosetting resin and a photocurable resin, a liquid sealing material is usually used. When the liquid sealing material is used, a phenomenon wherein the thickness of the edge portion becomes thicker or thinner compared to the center portion, in relation to surface tension, for example, may occur. Also, in the case of a curable resin, shrinkage, for example, of the volume at the time of curing tends to occur, and as a result, the thickness of the center portion and the edge portion of the cured sealing member may become uneven. When the thickness of the sealing member is uneven as described above, luminance unevenness may occur.

Meanwhile, when the sheet shaped sealing material is used, it is possible to avoid the occurrence of the surface unevenness of the sealing member such as the occurrence of the thickness distribution of the coating film due to the surface tension; and the occurrence of the thickness distribution due to the thermal shrinkage or the optical shrinkage, which occurs when the liquid sealing material is used. Therefore, it is possible to obtain a sealing member with good flatness, so that a higher quality display device may be provided.

(a) Thermoplastic Resin

In the present disclosure, for example, an olefin based resin, a vinyl acetate (EVA), and a polyvinyl butyral based resin may be used as the thermoplastic resin.

Among the above, the thermoplastic resin is preferably an olefin based resin. This is because the olefin based resin particularly rarely generates a component which deteriorates the LED substrate, and the melt viscosity is also low, so that the LED element described above may be well sealed. Also, among the olefin based resin, polyethylene based resins, polypropylene based resins, and ionomer based resins are preferable.

Here, the polyethylene based resin in the present descriptions includes not only ordinary polyethylene obtained by polymerizing ethylene, but also a resin obtained by polymerizing a compound having an ethylenically unsaturated bond such as a α-olefin; a resin obtained by copolymerizing a plurality of different compounds having an ethylenically unsaturated bond; and a modified resin obtained by grafting another chemical species to these resins.

Particularly, in view of obtaining the haze value described above, the sealing member in the present disclosure preferably includes a polyethylene based resin with a density lower limit value of 0.870 $g/cm^3$ or more as a base resin; and particularly preferably includes a polyethylene based resin with a density of 0.890 $g/cm^3$ or more as a base resin. Meanwhile, it preferably includes a polyethylene based resin with a density upper limit value of 0.930 $g/cm^3$ or less as a base resin; and particularly preferably includes a polyethylene based resin with a density of 0.930 $g/cm^3$ or less as a base resin. When the sealing member is a multi-layer member as will be described later, the polyethylene based resin with the density described above is preferably used as a base resin of the core layer.

Figure 4A:
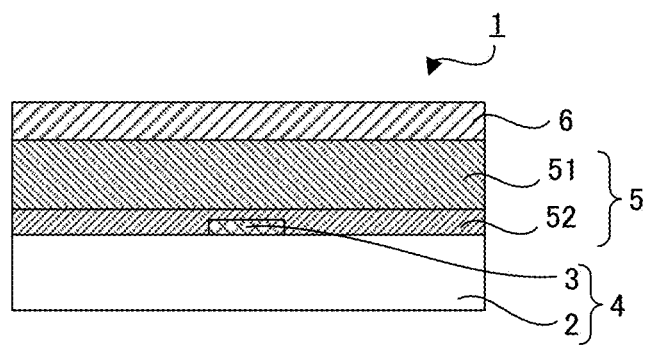
FIGS. 4A and 4B are schematic cross-sectional views illustrating an example of the structure of the sealing member of a surface-emitting device in the present disclosure.
Figure 4B:
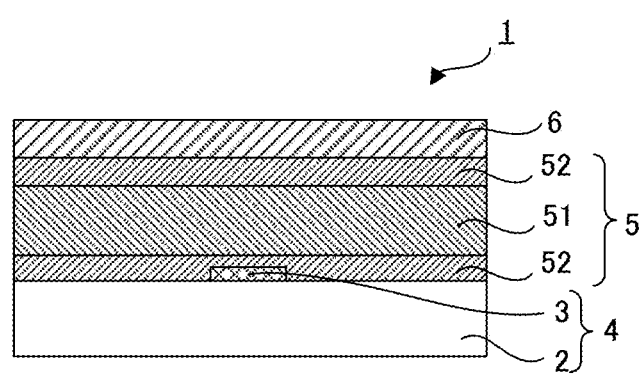

Incidentally, as shown in FIGS. 4A and 4B, the core layer indicates a core layer when the sealing member 5 is a plurality resin layers including a core layer 51 and a skin layer 52 placed on at least one surface of the core layer 51. Also, the base resin refers to resin included in an amount of 50 parts by mass or more when the total amount of the resin components included in the layer is regarded as 100 parts by mass.

As the α-olefin resin, a silane copolymer obtained by copolymerizing an α-olefin and an ethylenically unsaturated silane compound as comonomers (hereinafter, also referred to as "silane copolymer") may be preferably used. By using such resins, it is possible to obtain higher adhesiveness between the LED substrate and the sealing member. As the above silane copolymer, those described in Japanese Patent Application Laid-Open (JP-A) No. 2018-50027 may be used.

As for the polyethylene based resin, polyethylene derived from biomass (hereinafter may be referred to as biomass polyethylene) may be used. By using the biomass polyethylene, the environmental load reduction of the sealing member may be improved.

The ethylene derived from biomass may be produced from ethanol derived from biomass as a raw material. Particularly, it is preferable to use fermented ethanol derived from biomass obtained from plant raw materials. The plant raw materials are not particularly limited, and conventionally known plants may be used. Examples thereof may include corn, sugarcane, beet, and manioc.

The fermented ethanol derived from biomass refers to ethanol obtained by producing by contacting microorganisms producing ethanol or products derived from its crushed products with a culture solution including a carbon source obtained from plant raw material, and then purifying. Conventionally known methods such as distillation, membrane separation, and extraction may be applied to the purification of the ethanol from the culture solution. Examples of the method may include a method wherein benzene, or cyclohexane, for example, is added, and water is separated by, for example, an azeotropic method or a membrane separation.

In recent years, along with the growing demand for the establishment of a recycling-oriented society, there has been a need to move away from fossil fuels, also in the materials field as well as energy, and the use of biomass has been attracting attention. The biomass is an organic compound photosynthesized from carbon dioxide and water. When being used, it becomes carbon dioxide and water again, that is, so-called carbon neutral renewable energy. Recently, the practical application of biomass plastics using these biomass as raw materials has been rapidly progressed, and attempts to produce various resins from biomass raw materials have been carried out.

In the present disclosure, the sealing member preferably includes 20% by mass or more, more preferably 50% by mass of the biomass polyethylene. By setting the amount in the above range, it is possible to effectively reduce the environmental load.

The presence or absence of the biomass polyethylene in the sealing member, and content thereof may be measured in accordance with ISO 16620-2 Method C (AMS method for Carbon-14 (radioactive carbon) Analysis).

(b) Melting Point

The melting point of the thermoplastic resin used in the present disclosure is not particularly limited as long as it is able to seal the LED element, and the lower limit of the melting point is preferably, for example, 90° C. or more. Meanwhile, the upper limit of the melting point is preferably 135° C. or less, and particularly preferably 120° C. or less. When the melting point is in the above range, the softening of the sealing member due to heat generation during LED emission may be suppressed.

Incidentally, the melting point of the thermoplastic resins may be measured, for example, by differential scanning calorimetry (DSC) in accordance with the plastic transition temperature measuring method (JISK7121: 2012). When a plurality of types of the thermoplastic resin are included, the temperature of the melting peak top having highest melting heat quantity is employed. When the sealing member is a multi-layer member as will be described later, the thermoplastic resin with the melting point described above is preferably used as a base resin of the core layer.

(c) Melt Mass Flow Rate (MFR)

Also, as the thermoplastic resin in the present disclosure, those having melt viscosities capable of following and entering into the gap of the unevenness of the LED element and other members placed on one surface side of the LED substrate by being heated, are suitably used.

Specifically, the melt mass flow rate (MFR) of the thermoplastic resin to be used is preferably 0.5 g/10 min or more and 40 g/10 min or less, more preferably 2.0 g/10 min or more and 40 g/10 min or less, and further preferably 2.0 g/10 min or more and 20 g/10 min or less. When the MFR is in the above range, the resin may penetrate into the gap between the LED elements and so on, so that a sufficient sealing performance may be exhibited, and further, a sealing member excellent in close adhesiveness with respect to the LED substrate may be obtained.

Incidentally, the MFR in the present descriptions refers to a value measured according to JIS K7210-1:2014 at 190° C. and load of 2.16 kg (A method). However, the MFR of the polypropylene resin refers to a value of the MFR, similarly measured according to JIS K7210-1:2014 at 230° C. and load of 2.16 kg (A method).

For the MFR when the sealing member is a multi-layer member as will be described later, the measured value obtained by carrying out a measurement in a multi-layer condition wherein all the layers are stacked as one, according to the measurement method described above is regarded as the MFR value of the multi-layer sealing member.

(d) Elastic Modulus

Also, as for the thermoplastic resin in the present disclosure, the tensile elastic modulus at room temperature (25° C.) is preferably $5.0 \times 10^7$ Pa or more and $1.0 \times 10^9$ Pa or less. Sufficient adhesion to the LED substrate may be exhibited, and for example, when an impact is applied to the surface-emitting device from outside, the sealing member is excellent in impact resistance. When the sealing member is a multi-layer member as will be described later, the thermoplastic resin with the elastic modulus described above is preferably used as a base resin of the core layer.

The tensile elastic modulus is measured under the following conditions in conformity with JISK7161-1:2014, Plastics—how to determine tensile properties—Part 1: General rules (kikakurui.com).

Sample width: 10 mm
Distance between gauge lines: 50 mm
Drawing rate: 100 mm/min Incidentally, as the measurement device, a tensilon universal material testing instrument RTG-1210 (from A & D Company, Limited) may be used.

In addition to the thermoplastic resin, an additive such as an antioxidant and a light stabilizer may be added to the sealing member.

(3) Structure of Sealing Member

As for the sealing member in the surface-emitting device in the present disclosure, as shown in FIG. 1 for example, the sealing member 5 may be a single layer member including a single resin layer, and as shown in FIGS. 4A and 4B, the sealing member 5 may be a multi-layer member wherein a plurality of resin layers (two layers in FIG. 4A, and three layers in FIG. 4B), including a core layer 51, and a skin layer 52 placed on at least one surface of the core layer 51, are stacked. In the present disclosure, any one of a single layer, two layers, and three layers are preferable.

When the sealing member in the present disclosure is the multi-layer member of the two-layer structure including the core layer, and the skin layer placed on the LED substrate side of the core layer, the thickness ratio of the skin layer and the core layer, when skin layer/core layer is regarded as "a", the lower limit of the value "a" is preferably 0.10 or more, and particularly preferably, 0.17 or more. Meanwhile, the upper limit of the value "a" is preferably 10 or less, particularly preferably 2 or less.

Also, when the sealing member in the present disclosure is a multi-layer member of a three-layer structure, where one skin layer is regarded as a first skin layer and the other skin layer is regarded as a second skin layer, the thickness ratio of the first skin layer, the core layer, and the second skin layer wherein the first skin layer/the core layer is regarded as "b", and the second skin layer/the core layer is regarded as "c", the lower limit of both "b" and "c" are preferably 0.10 or more, and more preferably 0.13 or more. Meanwhile, the upper limit is preferably 1.0 or less, and particularly preferably 0.5 or less.

When the sealing member in the present disclosure is the multi-layer member, the core layer and the skin layer preferably include the thermoplastic resin with different density range, melting point, or the like as base resins. The reason therefor is to easily secure the haze value by the core layer, while securing an adhesion with respect to the LED substrate and a molding property by the skin layer.

In the case of the multi-layer member, usually expensive material with good adhesion property and molding property capable of entering into the gap of the LED element and so on, may be used for the skin layer placed on the LED substrate side in the multi-layer member. In the multi-layer member, the material included in the skin layer placed on the LED substrate side is not particularly limited as long as it has a high adhesion property and a high molding property, and for example, as for the thermoplastic resin described above, it is preferable to use the silane copolymer described above. Also, as for the thermoplastic resin, the material preferably includes the olefin based resin and silane coupling agent described above. Incidentally, an additive such as an antioxidant and a light stabilizer may be added to this layer.

(4) Preferable Sealing Member

The sealing member in the present disclosure is preferably a multi-layer member including a plurality of layers including a core layer and a skin layer placed on at least one outermost surface. The core layer preferably includes a polyethylene based resin with a density of 0.900 g/cm$^3$ or more and 0.930 g/cm$^3$ or less as a base resin. The skin layer preferably includes a polyethylene based resin with a density of 0.875 g/cm$^3$ or more and 0.910 g/cm$^3$ or less, with lower density than the base resin for the core layer, as a base resin.

As the base resin for the core layer, a low-density polyethylene based resin (LDPE), a linear low-density polyethylene based resin (LLDPE), or a metallocene based linear low-density polyethylene based resin (M-LLDPE) may be preferably used. Among them, from the viewpoint of long-term reliability, a low-density polyethylene based resin (LDPE) may be particularly preferably used as a base resin for the core layer. Also, as described above, biomass polyethylene may be used.

The lower limit value of the density of polyethylene based resin used as the base resin for the core layer is preferably 0.900 g/cm$^3$ or more. Meanwhile, the upper limit value of the density is preferably 0.930 g/cm$^3$ or less, and more preferably 0.920 g/cm$^3$ or less. By setting the density of the base resin for the core layer in the above range, the haze value of the sealing member in the present disclosure may be the predetermined value or more. Also, it is possible to provide sufficient heat resistance required for the sealing member without undergoing a crosslinking treatment.

The melting point of the polyethylene based resin used as the base resin for the core layer is preferably 90° C. or more and 135° C. or less, and more preferably 90° C. or more and 115° C. or less. By setting the melting point in the above range, the heat resistance and the molding property of the sealing member may be maintained in a preferable range. Incidentally, by adding a resin with a high melting point such as polypropylene to the sealing material composition for the core layer, it is possible to increase the melting point of the sealing member to approximately 165° C. In this case, 5% by mass or more and 40% by mass or less of the polypropylene is preferably included, with respect to the total resin components of the core layer.

The polypropylene to be included in the core layer is preferably a homopolypropylene (homo PP) resin. Since the homo PP is a polymer including only polypropylene simples and has high crystallinity, it has even higher rigidity compared with block PP or random PP. By using this as an additive resin to the sealing material composition for the core layer, the dimensional stability of the sealing member may be increased. Also, the MFR measured according to JIS K7210-1:2014 at 230° C. and at a load of 2.16 kg (A method), of the homo PP used as an additive resin to the sealing material composition for the core layer, is preferably 5 g/10 min or more and 125 g/10 min or less. When the MFR is too low, the molecular weight is increased so that the rigidity is too high, and the preferable sufficient flexibility of the sealing material composition is hardly ensured. Also, when the MFR is too high, the fluidity at the time of heating may not be sufficiently suppressed, and the heat resistance and dimensional stability may not be sufficiently imparted to the sealing member sheet.

The lower limit value of MFR at 190° C. and at a load of 2.16 kg (A method) of the polyethylene based resin used as the base resin for the core layer is preferably 1.0 g/10 min or more, and more preferably 1.5 g/10 min or more. Meanwhile, the upper limit value of MFR is preferably 7.5 g/10 min or less, more preferably 6.0 g/10 min or less. By setting the MFR of the base resin for the core layer in the above range, the heat resistance and the molding property of the sealing member may be maintained in a preferable range. Also, the processability at the time of film formation may be sufficiently enhanced to contribute to the improvement of the productivity of the sealing member.

The lower limit value of the content of the base resin with respect to the total resin components in the core layer is preferably 70% by mass or more, and particularly preferably 90% by mass or more. Meanwhile, the upper limit value of the content of the base resin is preferably 99% by mass or less. As long as the base resin is included in the above range, other resins may be included.

As the base resin for the skin layer of the sealing member, a low-density polyethylene based resin (LDPE), a linear low-density polyethylene based resin (LLDPE), or a metallocene based linear low-density polyethylene based resin (M-LLDPE) may be preferably used, as similar to the sealing material composition for the core layer. Among them, from the viewpoint of the molding property, a metallocene based linear low-density polyethylene based resin (M-LLDPE) may be particularly preferably used as the sealing material composition for the skin layer. Also, as described above, biomass polyethylene may be used.

The lower limit value of the density of polyethylene based resin used as the base resin for the skin layer is preferably 0.875 g/cm$^3$ or more. Meanwhile, the upper limit value of the density of the polyethylene based resin is preferably 0.910 g/cm$^3$ or less, and more preferably 0.899 g/cm$^3$ or less. By setting the density of the base resin for the skin layer in the above range, the adhesiveness of the sealing member may be maintained in a preferable range.

The lower limit value of the melting point of the polyethylene based resin used as the base resin for the skin layer is preferably 50° C. or more, and more preferably 55° C. or more. Meanwhile, the upper limit value of the melting point is preferably 100° C. or less, and more preferably 95° C. or less. By setting the melting point in the above range, the adhesiveness of the sealing member may further be improved for sure.

The lower limit value of MFR at 190° C. and at a load of 2.16 kg (A method) of the polyethylene based resin used as the base resin for the skin layer is preferably 1.0 g/10 min or more, and more preferably 1.5 g/10 min or more. Meanwhile, the upper limit value of MFR is preferably 7.0 g/10 min or less, and more preferably 6.0 g/10 min or less. By setting the MFR of the base resin for the skin layer in the above range, the adhesiveness of the sealing member may be maintained in a further preferable range. Also, the processability at the time of film formation may be sufficiently enhanced to contribute to the improvement of the productivity of the sealing member.

The lower limit value of the content of the base resin with respect to the total resin components in the skin layer is preferably 60% by mass or more, and particularly preferably 90% by mass or more. Meanwhile, the upper limit value of the content of the base resin is preferably 99% by mass or less. As long as the base resin is included in the above range, other resins may be included.

In all of the sealing material compositions described above, it is more preferable that a silane copolymer obtained by copolymerizing an α-olefin and an ethylenically unsaturated silane compound as comonomers, is included in each of the sealing material compositions in a constant amount, if necessary. Since degree of freedom, of a silanol group contributing to an adhesive force, of such graft copolymer is high, adhesiveness of the sealing member to other members may be improved.

Examples of the silane copolymer may include a silane copolymer described in JP-A No. 2003-46105. By using the silane copolymer as a component of the sealing material composition, a sealing member having the following properties may be obtained stably at low cost: excellent in strength, and durability, for example; excellent in weather resistance, heat resistance, water resistance, light resistance, and various other characteristics; and further, exhibits outstanding heat fusion property, not being affected by production conditions such as heat compression bonding at the time of placing the sealing member.

As the silane copolymer, any one of a random copolymer, an alternating copolymer, a block copolymer, and a graft copolymer may be preferably used, and a graft copolymer is more preferable, and a graft copolymer obtained by polymerizing a polyethylene for polymerization as a main chain, and an ethylenically unsaturated silane compound as a side chain is further preferable. Since degree of freedom of a silanol group contributing to an adhesive force, of such graft copolymer, is high, adhesiveness of the sealing member may be improved.

The lower limit value of the content of the ethylenically unsaturated silane compound constituting the copolymer of an α-olefin and an ethylenically unsaturated silane compound is preferably, for example, 0.001% by mass or more, more preferably 0.01% by mass or more, and particularly preferably 0.05% by mass or more, with respect to the total copolymer mass. Meanwhile, the upper limit value of the content of the ethylenically unsaturated silane compound is preferably 15% by mass or less, more preferably 10% by mass or less, and particularly preferably 5% by mass or less. Although the mechanical strength, and the heat resistance, for example, are good when the content of the ethylenically unsaturated silane compound constituting the copolymer of the α-olefin and the ethylenically unsaturated silane compound is high, the tensile elongation, and heat fusibility, for example, tend to be low, when the content thereof is too much.

In the sealing material composition for the core layer, the lower limit value of the content of the silane copolymer with respect to the total resin components of the sealing material composition is preferably 0% by mass or more. Meanwhile, the upper limit value is preferably 20% by mass or less. In the sealing material composition for the skin layer, the lower limit value of the content of the silane copolymer with respect to the total resin components of the sealing material composition is preferably 5% by mass or more. Meanwhile, the upper limit value is preferably 40% by mass or less. In particular, it is more preferable that 5% by mass or more of the silane copolymer is included in the sealing material composition for the skin layer. Incidentally, the lower limit value of the silane modification amount in the silane copolymer is preferably 0.1% by mass or more. Meanwhile, the upper limit value of the silane modification amount in the silane copolymer is preferably approximately 2.0% by mass or less. The content range of the preferable silane copolymer in the sealing material composition described above assumes that the silane modification amount is in this range, and it is desirable to appropriately adjust finely according to the variation of this modification amount.

An additive such as an antioxidant and a light stabilizer may be added to all of the layers of the sealing member. Also, an adhesion improving agent may be added as appropriate. By adding the adhesion improving agent, the adhesiveness durability with other members may be enhanced. A known silane coupling agent may be used as the adhesion improving agent, and silane coupling agents including a vinyl group such as vinyl trimethoxysilane and vinyl triethoxysilane; silane coupling agent including an epoxy group; or silane coupling agents including a mercapto group may be particularly preferably used.

(5) Method for Forming Sealing Member

As described above, the sealing member in the present disclosure may be formed using a sealing member sheet including a sealing material composition including the thermoplastic resin and other components.

The sealing member sheet is obtained by subjecting a shape forming process by a conventionally known method to the sealing material composition to form into a sheet-shape.

When the sealing member is a multi-layer member, as shown in FIG. 4A for example, a sealing member 5 with a two-layer structure of the core layer 51, and the skin layer 52 may be produced by forming a multi-layer film of a two-layer structure including a core layer and a skin layer placed on one surface of the core layer, with each sealing material composition for a core layer and for a skin layer in a predetermined thickness. Alternatively, as shown in FIG. 4B for example, a sealing member 5 with a three-layer structure of the skin layer 52, the core layer 51, and the skin layer 52 may be produced by forming a multi-layer film of a three-layer structure including the skin layers placed on both surfaces of the core layer.

3. Diffusion Member

The surface-emitting device in the present disclosure may include a diffusion member. The diffusion member is placed on the sealing member, on the opposite surface side to the LED substrate side. The diffusion member is not particularly limited as long as it is a member having a function to diffuse the light emitted from the LED element, and emitting evenly in the surface direction, and examples thereof may include the following first diffusion member, second diffusion member, and third diffusion member.

(1) First Diffusion Member

The first diffusion member usually includes a resin layer wherein at least a diffusion agent is dispersed. The diffusion member may be, for example a resin sheet including a diffusion agent dispersed therein, may be a stacked body including a resin layer including a diffusion agent dispersed therein, on a transparent substrate, and the former is more preferable. The resin included in the resin layer is not particularly limited as long as the diffusion agent may be dispersed, and is preferably a thermoplastic resin. Since the diffusion member may be formed using a resin sheet including a diffusion agent dispersed therein, good flatness may be obtained.

The thermoplastic resin used for the diffusion member is not particularly limited as long as it has high light transmittance, and ones commonly used in the field of display device may be used.

The material of the diffusion agent is not particularly limited as long as it is capable of diffusing the light from the LED element, and for example, it may be an organic material, and it may be an inorganic material. When the material of the diffusion agent is an organic material, examples thereof may include polymethylmethacrylate (PMMA). Meanwhile, when the material of the diffusion agent is an inorganic material, examples thereof may include $TiO_2$, $SiO_2$, $Al_2O_3$, and silicon.

The refractive index of the diffusion agent is not particularly limited as long as it is capable of diffusing the light from the LED element, and is, for example, 1.4 or more and 2 or less. Such refractive index may be measured by an Abbe refractometer. Examples of the shape of the diffusion agent may include a granular shape. The average particle size of the diffusion agent is, for example, 1 μm or more and 100 μm or less.

The ratio of the diffusion agent in the diffusion member is not particularly limited as long as it is capable of diffusing the light from the LED element, and is, for example, 40% by weight or more and 60% by weight or less.

(2) Second Diffusion Member

The second diffusion member is a member including a first layer and a second layer, in this order from the LED substrate side, wherein the first layer has a light transmittivity and a light diffusivity; and the second layer is a member wherein the reflectance of light increases as an absolute value of the incident angle with respect to the first layer side surface of the second layer decreases, and the transmittance of light increases as the absolute value of the incident angle with respect to the first layer side surface of the second layer increases. In the present disclosure, by including the diffusion member described above, it is possible to further improve the in-plane uniformity of luminance, while realizing the reduction of the thickness. Also, it is also possible to reduce the cost and power consumption.

Figure 5:
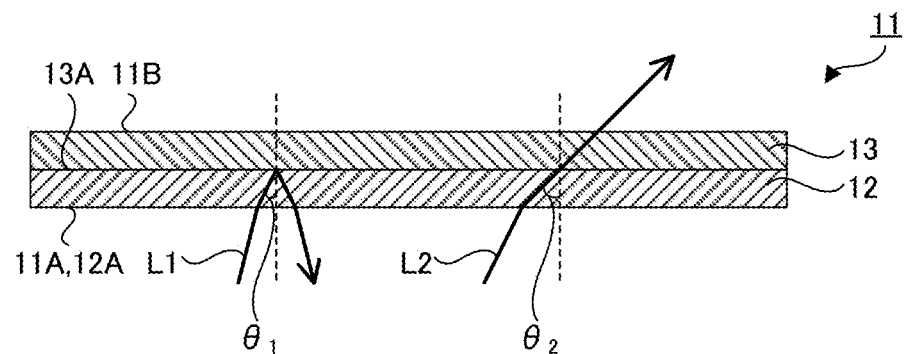
FIG. 5 is a schematic cross-sectional view illustrating an example of a second diffusion member.

The second diffusion member will be hereinafter explained with reference to drawings. FIG. 5 is a schematic cross-sectional view illustrating an example of the second diffusion member. As shown in FIG. 5, a diffusion member 11 includes a first layer 12 and a second layer 13 in this order. The first layer 12 has light transmittivity and light diffusivity, and transmits and diffuses incident lights L1 and L2 from the surface 12A opposite to the second layer 13 side surface of the first layer 12. Also, in the second layer 13, the reflectance of light increases as the absolute value of the incident angle with respect to the first layer 12 side surface 13A of the second layer 13 decreases, and the transmittance of light increases as the absolute value of the incident angle with respect to the first layer 12 side surface 13A of the second layer 13 increases. Therefore, in the second layer 13, it is possible to reflect incident light L1 with low incident angle θ1 with respect to the first layer 12 side surface 13A of the second layer 13, and to transmit incident light L2 with high incident angle θ2 with respect to the first layer 2 side surface 13A of the second layer 13. Incidentally, the low incident angle refers to one whose absolute value of the incident angle is small, and the high incident angle refers to one whose absolute value of the incident angle is large.

Figure 6:
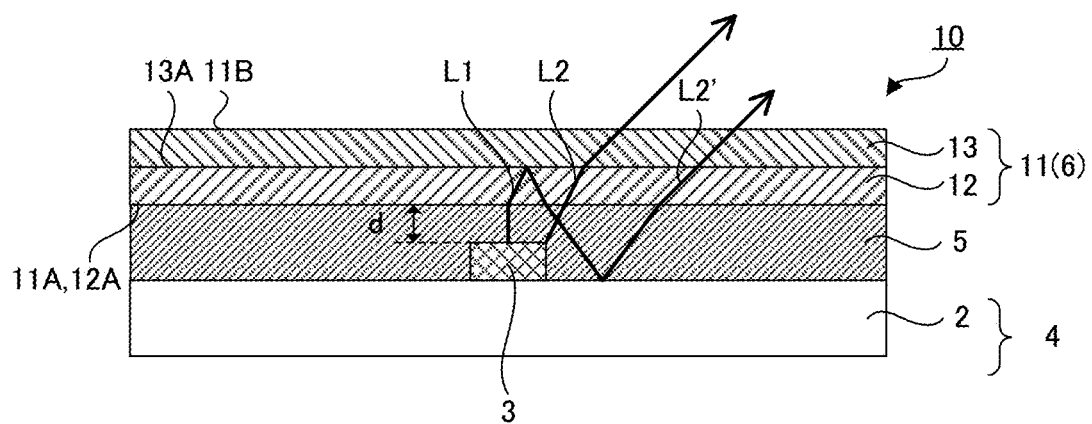
FIG. 6 is a schematic cross-sectional view illustrating an example of a surface-emitting device provided with a second diffusion member in the present disclosure.

FIG. 6 is a schematic cross-sectional view illustrating an example of a surface-emitting device in the present disclosure including the second diffusion member shown in FIG. 5. As shown in FIG. 6, surface-emitting device 10 comprises: a LED substrate 4 including a LED element 3 placed on one surface of a supporting substrate 2; a sealing member 5 placed on a LED element 3 side surface of the LED substrate 4, and configured to seal the LED element 3; and a diffusion member 11 placed on the sealing member 5, on a surface opposite to the LED substrate 4 side. The diffusion member 11 is placed so that the first layer 12 side surface 11A faces the sealing member 5.

As shown in FIG. 5, it is possible to diffuse the incident light from the first layer 12 side surface 11A of the diffusion member 11 by the first layer 12, as well as to reflect incident light L1 with low incident angle θ1 with respect to the first layer 12 side surface 13A of the second layer 13, among the light transmitted and diffused through the first layer 12, by the first layer 12 side surface 13A of the second layer 13, and to diffuse by entering into the first layer 12 again, as shown in FIG. 5. Also, among the light transmitted and diffused through the first layer 12, incident light L2 and L2' with high incident angle θ2 with respect to the first layer 12 side surface 13A of the second layer 13 may be transmitted through the second layer 13, and may be emitted from the second layer 13 side surface 11B of the diffusion member 11.

Also, by combining the first layer and the second layer, incident light from the first layer side surface of the diffusion member, in particular, incident light with low incident angle from the first layer side surface of the diffusion member may be diffused by transmitting through the first layer many times, so that it may be emitted with high emitting angle from the second layer side surface of the diffusion member. Therefore, in the surface-emitting device including such diffusion member (particularly the downlight type system LED backlight), the light emitted from the LED element may be diffused to the entire light emitting surface, thereby further improving the in-plane uniformity of luminance.

Also, by combining the first layer and the second layer, since the incident light with low incident angle from the first layer side surface of the diffusion member may be transmitted through the first layer many times, the optical route length from the point where the light enters from the first layer side surface of the diffusion member to the point where the light is emitted from the second layer side surface of the diffusion member, may be increased. Thereby, a part of the light emitted from the LED element, and then, emitted from the second layer side surface of the diffusion member may be emitted from a position away from the LED element in in-plane direction, rather than directly above the LED element.

a) First Layer

The first layer in the present disclosure is a member placed on one surface side of the second layer described later, and has light transmittivity and light diffusivity. As the light transmittivity of the first layer, for example, the total light transmittance of the first layer is preferably 50% or more, and among the above, preferably 70% or more, and particularly preferably 90% or more. By the total light transmittance of the first layer being in the range described above, the luminance of the surface-emitting device in the present disclosure may be increased.

Incidentally, the total light transmittance of the first layer may be measured, for example, by a method according to JIS K7361-1:1997.

The light diffusivity of the first layer may be, for example, a light diffusivity that randomly diffuses light, and may be a light diffusivity that diffuses light mainly in a specific direction. The light diffusivity that diffuses light mainly in a specific direction is a property of deflecting light, that is, a property of changing the traveling direction of the light. As the light diffusivity of the first layer, when light diffusivity is a light diffusivity that randomly diffuses light, for example, the diffusion angle of the light entering the first layer may be 10° or more, may be 15° or more, and may be 20° or more. Also, the diffusion angle of the light entering the first layer may be, for example, 85° or less, may be 60° or less, and may be 50° or less. By the diffusion angle being in the range described above, the in-plane uniformity of luminance of the surface-emitting device in the present disclosure may further be improved.

Figure 7:
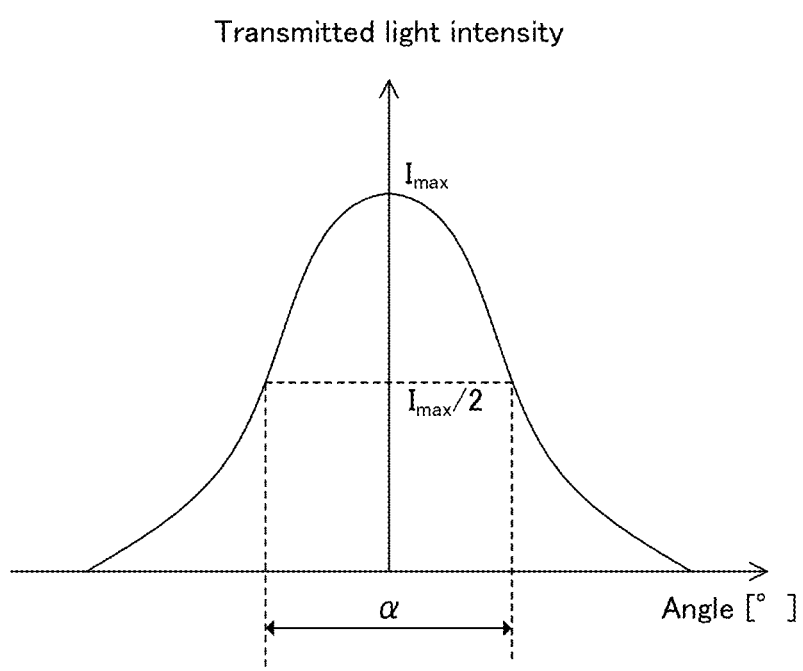
FIG. 7 is a graph illustrating an example of a transmitted light intensity distribution.

Here, the diffusion angle will be described. FIG. 7 is a graph illustrating an example of a transmitted light intensity distribution, and is a diagram explaining a diffusion angle. In the present descriptions, a half-width (FWHM) that is a difference between two angles those are ½ of maximum transmitted light intensity Imax of the light perpendicularly enters to one surface of the first layer constituting the diffusion member and emits from the other surface of the first layer, is defined as a diffusion angle α.

Incidentally, the diffusion angle may be measured using a gonio photometer or a gonio-spectrophotometric color measurement device. For measuring the diffusion angle, for example, Gonio Photometer GP-200 from Murakami Color Research Laboratory may be used.

The first layer is not particularly limited as long as it has the light transmittivity and light diffusivity described above, and examples thereof may include a transmission-type diffraction grating; a microlens array; and a diffusion agent-containing resin film containing a diffusion agent, and a resin. Specifically, when the first layer has a light diffusivity that diffuses light mainly in a specific direction, examples thereof may include a transmission-type diffraction grating and microlens array. Meanwhile, when the first layer has a light diffusivity that randomly diffuses light, examples thereof may include a diffusion agent-containing resin film. In particular, a transmission-type diffraction grating and microlens array are preferable from the viewpoint of light diffusivity. Incidentally, the transmission-type diffraction grating is also referred to as a transmission-type diffractive optical element (DOE).

When the first layer is a transmission-type diffraction grating, the transmission-type diffraction grating is not particularly limited as long as it has the light transmittivity and light diffusivity described above. The pitch, for example, of the transmission-type diffraction grating may be appropriately adjusted so as to obtain the light transmittivity and light diffusivity described above. Specifically, when the wavelength of the light output by the LED element is a single color such as red, green, and blue, the light from the LED element may be effectively bent by setting the pitch according to the respective wavelengths.

As the material constituting the transmission-type diffraction grating, any material may be used as long as a transmission-type diffraction grating having the light transmittivity and light diffusivity described above may be obtained, and a material usually used for a transmission-type diffraction grating may be used. Also, the method for forming a transmission-type diffraction grating may be similar to the method for forming a common transmission-type diffraction grating.

When the first layer is a microlens array, the microlens array is not particularly limited as long as it has the light transmittivity and light diffusivity described above. The shape, pitch, and size, for example, of the microlens may be appropriately adjusted so as to obtain the light transmittivity and light diffusivity described above. As a material constituting the microlens, any material may be used as long as a microlens having the light transmittivity and light diffusivity described above may be obtained, and a material commonly used for a microlens may be employed. Also, the method for forming a microlens may be similar to a common method for forming a microlens.

When the first layer is a diffusion agent-containing resin film, the diffusion agent-containing resin film is not particularly limited as long as it has the light transmittivity and light diffusivity described above.

The first layer may have any structure capable of exhibiting light diffusivity; for example, the light diffusivity may be exhibited with the entire layer, and the light diffusivity may be exhibited with the surface thereof. Examples of the structure wherein the light diffusivity is exhibited with the surface thereof may include a relief-type diffraction grating and a microlens array. Meanwhile, examples of the structure wherein the light diffusivity is exhibited with the entire layer may include a volume-type diffraction grating and a diffusion agent-containing resin film. Examples of the method for stacking the first layer and the second layer may include a method wherein the first layer and the second layer are adhered via an adhesive layer or a pressure-sensitive adhesive layer; and a method wherein the first layer is formed directly on one surface of the second layer. Examples of a method for forming the first layer directly on one surface of the second layer may include a printing method, and a resin shaping by a mold.

b) Second Layer

The second layer in the present disclosure is a member placed on one surface side of the first layer, and has an incident angle dependency in reflectance wherein the reflectance of light increases as the absolute value of the incident angle with respect to the first layer side surface of the second layer decreases; and an incident angle dependency in transmittance wherein the transmittance of light increases as the absolute value of the incident angle with respect to the first layer side surface of the second layer increases.

The second layer has an incident angle dependency in reflectance such that the reflectance of light increases as the absolute value of the incident angle with respect to the first layer side surface of the second layer decreases. That is, the reflectance of incident light with a low incident angle with respect to the first layer side surface of the second layer is larger than the reflectance of incident light with a high incident angle with respect to the first layer side surface of the second layer. Among the above, the reflectance of incident light with a low incident angle with respect to the first layer side surface of the second layer is preferably large.

Specifically, the lower limit value of the regular reflectance of visible incident light to the first layer side surface of the second layer with an incident angle of within +60° is preferably 50% or more, more preferably 80% or more, and particularly preferably 90% or more. Meanwhile, the upper limit regular reflectance of the regular reflectance of visible light is preferably less than 100%. Incidentally, for all incident angles with the incident angle of within +60°, it is preferable that the regular reflectance of the visible light satisfies the range described above. When the regular reflectance is in the range described above, the in-plane uniformity of luminance of the surface-emitting device in the present disclosure may further be improved.

Also, the lower limit value of the average value of the regular reflectance of visible incident light to the first layer side surface of the second layer with the incident angle of within ±60° is preferably, for example, 80% or more, and more preferably 90% or more. Meanwhile, the upper limit value of the average value of the regular reflectance is preferably 99% or less, particularly preferably 97% or less. Incidentally, the average value of the regular reflectance refers to an average value of the regular reflectance of the visible light at the respective incident angles. By the average value of the regular reflectance being in the range described above, the in-plane uniformity of luminance of the surface-emitting device in the present disclosure may further be improved.

Also, the lower limit value of the regular reflectance of visible incident light to the first layer side surface of the second layer with an incident angle of 0° (perpendicularly incident) is preferably, for example, 80% or more, more preferably 90% or more, and particularly preferably 95% or more. Meanwhile, the upper limit value of the regular reflectance is preferably less than 100%. When the regular reflectance is in the range described above, the in-plane uniformity of luminance of the surface-emitting device in the present disclosure may further be improved.

Incidentally, in the present descriptions, "visible light" means light having a wavelength of 380 nm or more and 780 nm or less. Also, the regular reflectance may be measured using a gonio photometer or a gonio-spectrophotometric color measurement device. For measuring the regular reflectance, Gonio Photometer GP-200 from Murakami Color Research Laboratory may be used.

The second layer has an incident angle dependency in transmittance such that the transmittance of light increases as the absolute value of the incident angle with respect to the first layer side surface of the second layer increases. That is, the transmittance of the incident light with a high incident angle with respect to the first layer side surface of the second layer is larger than the transmittance of the incident light with a low incident angle with respect to the first layer side surface of the second layer. Among the above, the transmittance of incident light with a high incident angle with respect to the first layer side surface of the second layer is preferably large. Specifically, the total light transmittance of the incident light with an incident angle of 70° or more and less than 90°, with respect to the first layer side surface of the second layer, is preferably 30% or more, more preferably 40% or more, and particularly preferably 50% or more. Incidentally, for all incident angles with the incident angle of 70° or more and less than 90°, it is preferable that the total light transmittance satisfies the range described above. Also, when the absolute value of the incident angle is 70° or more and less than 90°, it is preferable that the total light transmittance satisfies the range described above. By the total light transmittance being in the range described above, the in-plane uniformity of luminance of the surface-emitting device in the present disclosure may further be improved.

Incidentally, the total light transmittance of the second layer may be measured by, using a gonio photometer or a gonio-spectrophotometric color measurement device by a method according to JIS K7361-1:1997. For measuring the total light transmittance, for example, an ultraviolet-visible near-infrared spectrophotometer V-7200 from JASCO Corporation may be used.

The second layer is not particularly limited as long as it has the incident angle dependency in reflectance and transmittance described above, and various configurations having the incident angle dependency in reflectance and transmittance described above may be employed. Examples of the second layer may include a dielectric multi-layer film; a reflective structure including a first reflective film in a pattern form and a second reflective film in a pattern form, in this order from the first layer side, wherein the opening of the first reflective film and the opening of the second reflective film are placed so as not to overlap in a plan view, and the first reflective film and the second reflective film are placed apart from each other in the thickness direction; and a reflection-type diffraction grating.

A case wherein the second layer is a dielectric multi-layer film, a reflective structure, or a reflection-type diffraction grating is hereinafter explained.

i) Dielectric Multi-Layer Film

When the second layer is a dielectric multi-layer film, examples of the dielectric multi-layer film may include a multi-layer film of an inorganic compound wherein inorganic layers having different refractive indices are alternately stacked; and a multi-layer film of resin wherein resin layers having different refractive indices are alternately stacked.

(Multi-Layer Film of Inorganic Compound)

When the dielectric multi-layer film is a multi-layer film of an inorganic compound wherein inorganic layers having different refractive indices are alternately stacked, the multi-layer film of an inorganic compound is not particularly limited as long as it has the incident angle dependency in reflectance and transmittance described above.

Among the inorganic layers having different refractive indices, the refractive index of the inorganic compound included in a high refractive index inorganic layer having a high refractive index may be, for example, 1.7 or more, and may be 1.7 or more and 2.5 or less. Examples of such inorganic compound may include one including titanium oxide, zirconium oxide, tantalum pentaoxide, niobium pentaoxide, lanthanum oxide, yttrium oxide, zinc oxide, zinc sulfide, or indium oxide as a main component, and including a small amount of, for example, titanium oxide, tin oxide, or cerium oxide.

Also, among the inorganic layers having different refractive indices, the refractive index of the inorganic compound included in a low refractive index inorganic layer having a low refractive index may be, for example, 1.6 or less, and may be 1.2 or more and 1.6 or less. Examples of such inorganic compound may include silica, alumina, lanthanum fluoride, magnesium fluoride, and sodium aluminum hexafluoride.

The number of the stacked layers of the high refractive index inorganic layer and the low refractive index inorganic layer may be appropriately adjusted so as to obtain the incident angle dependency in reflectance and transmittance described above. Specifically, the total number of stacked layers of the high refractive index inorganic layer and the low refractive index inorganic layer may be 4 layers or more. Also, the upper limit of the total number of stacked layers is not particularly limited; and since the increase in the number of stacked layers increases the number of processing steps, it may be, for example, 24 layers or less.

As the thickness of the multi-layer film of the inorganic compound, it may be any thickness as long as the incident angle dependency in reflectance and transmittance described above may be obtained, and may be, for example, 0.5 μm or more and 10 μm or less. Examples of a method for forming a multi-layer film of an inorganic compound may include a method wherein the high refractive index inorganic layer and low refractive index inorganic layer are alternately stacked by, for example, a CVD method, a sputtering method, a vacuum deposition method, and a wet coating method.

(Multi-Layer Film of Resin)

When the dielectric multi-layer film is a multi-layer film of a resin wherein resin layers having different refractive indices are alternately stacked, the multi-layer film of resin is not particularly limited as long as it has the incident angle dependency in reflectance and transmittance described above.

Examples of the resin constituting the resin layer may include a thermoplastic resin and a thermosetting resin. Among them, a thermoplastic resin is preferable because of its good molding ability.

Various additives such as an antioxidant, an antistatic agent, a crystal nucleating agent, an inorganic particle, an organic particle, a viscosity reducing agent, a heat stabilizer, a lubricant, an infrared absorber, an ultraviolet absorber, and a doping agent for adjusting the refractive index may be added to the resin layer.

As the thermoplastic resin, for example, olefin resins, alicyclic polyolefin resins, polyamide resins, aramid resins, polyester resins, polycarbonate resins, polyarylate resins, polyacetal resins, polyphenylene sulfide resins, fluororesins, acrylic resins, methacrylic resins, polyacetal resins, polyglycolic acid resins, and a polylactic acid resins may be used.

Examples of the polyolefin resins may include polyethylene, polypropylene, polystyrene, and polymethylpentene. Also, examples of the polyamide resins may include nylon 6, and nylon 66. Further, examples of the polyester resin may include polyethylene terephthalate, polybutylene terephthalate, polypropylene terephthalate, polybutyl succinate, and polyethylene-2,6-naphthalate. Also, examples of the fluororesins may include tetrafluoroethylene resin, trifluoroethylene resin, trifluorochloroethylene resin, tetrafluoroethylene-hexafluoropropylene copolymer, and vinylidene fluoride resin.

Among them, in the present disclosure, polyester is more preferable from the viewpoint of strength, heat resistance, and transparency.

In the present descriptions, a polyester refers to a homopolyester or a copolymer polyester which is a polycondensate of a dicarboxylic acid component skeleton and a diol component skeleton. Here, examples of the homopolyester may include polyethylene terephthalate, polypropylene terephthalate, polybutylene terephthalate, polyethylene-2,6-naphthalate, poly-1,4-cyclohexanedimethylene terephthalate, and polyethylene diphenylate. Among them, polyethylene terephthalate is preferable because of its low cost so that it may be used in a very wide variety of applications.

Also, in the present descriptions, a copolymer polyester is defined as a polycondensate including at least three or more components selected from a component having a dicarboxylic acid skeleton and a component having a diol skeleton described below. Examples of the component having a dicarboxylic acid skeleton may include terephthalic acid, isophthalic acid, phthalic acid, 1,4-naphthalenedicarboxylic acid, 1,5-naphthalenedicarboxylic acid, 2,6-naphthalenedicarboxylic acid, 4,4-diphenyldicarboxylic acid, 4,4-diphenylsulfondicarboxylic acid, adipic acid, sebacic acid, dimer acid, cyclohexanedicarboxylic acid and ester derivatives thereof. Examples of the component having a glycol skeleton may include ethylene glycol, 1,2-propanediol, 1,3-butanediol, 1,4-butanediol, 1,5-pentadiol, diethylene glycol, polyalkylene glycol, 2,2-bis(4-β-hydroxyethoxyphenyl) propane, isosorbate, 1,4-cyclohexanedimethanol, and spiroglycol.

Among the resin layers having different refractive indices, the difference in in-plane average refractive index between the high refractive index resin layer having a high refractive index and the low refractive index resin layer having a low refractive index is preferably 0.03 or more, more preferably 0.05 or more, and further preferably 0.1 or more. When the difference in the in-plane average refractive index is too small, sufficient reflectance may not be obtained. Here, the in-plane average refractive index is the refractive index in a direction parallel to the surface of the stacked film.

Also, the difference between the in-plane average refractive index and the thickness direction refractive index of the high refractive index resin layer is preferably 0.03 or more, and the difference between the in-plane average refractive index and the thickness direction refractive index of the low refractive index resin layer is preferably 0.03 or less. In this case, the reflectance at the reflectance peak is less likely to be decreased, even when the incident angle is increased.

As a preferable combination of a high refractive index resin used in the high refractive index resin layer and a low refractive index resin used in the low refractive index resin layer, firstly, the absolute value of the difference in the SP value of the high refractive index resin and the low refractive index resin is preferably 1.0 or less. When the absolute value of the difference in the SP value is in the range described above, delamination between layers is less likely to occur. The SP value is estimated by the Fedors method.

In this case, it is more preferable that the high refractive index resin and the low refractive index resin include the same basic skeleton. Here, the basic skeleton is a repeating unit constituting the resin. For example, when one of the resins is polyethylene terephthalate, ethylene terephthalate is a basic skeleton. Also, for example, when one of the resins is polyethylene, ethylene is a basic skeleton. When the high refractive index resin and the low refractive index resin are resins including the same basic skeleton, delamination between layers is further less likely to occur.

As a preferable combination of a high refractive index resin used in the high refractive index resin layer and a low refractive index resin used in the low refractive index resin layer, secondly, it is preferable that the difference in the glass transition temperature of the high refractive index resin and the low refractive index resin is 20° C. or less. When the difference in the glass transition temperature is too large, thickness uniformity may become poor when a stacked film of a high refractive index resin layer and a low refractive index resin layer is formed. Also, when the stacked film is formed, overstretching may occur in some cases.

Also, it is preferable that the high refractive index resin is polyethylene terephthalate or polyethylene naphthalate, and the low refractive index resin is a polyester including spiroglycol. Here, the polyester including spiroglycol refers to a copolyester obtained by copolymerizing spiroglycol, or a homopolyester, or a polyester obtained by blending them. Since the difference in glass transition temperature between the polyester including spiroglycol, and polyethylene terephthalate or polyethylene naphthalate is small, it is preferable that the overstretching in production thereof is less likely to occur, as well as the delamination between layers is less likely to occur.

More preferably, it is preferable that the high refractive index resin is polyethylene terephthalate or polyethylene naphthalate, and the low refractive index resin is a polyester including spiroglycol and cyclohexanedicarboxylic acid.

When the low refractive index resin is the polyester including spiroglycol and cyclohexanedicarboxylic acid, the difference in in-plane refractive index from polyethylene terephthalate or polyethylene naphthalate is large, so that a high reflectance is easily obtained. Also, since the difference in glass transition temperature from polyethylene terephthalate or polyethylene naphthalate is small, and the adhesive property is also excellent, the overstretching in production thereof is less likely to occur, as well as the delamination between layers is less likely to occur.

Further, it is also preferable that the high refractive index resin is polyethylene terephthalate or polyethylene naphthalate, and the low refractive index resin is a polyester including cyclohexanedimethanol. Here, the polyester including cyclohexanedimethanol refers to a copolyester obtained by copolymerizing cyclohexanedimethanol, or a homopolyester, or a polyester obtained by blending them. Since the difference in glass transition temperature between the polyester including cyclohexanedimethanol and polyethylene terephthalate or polyethylene naphthalate is small, it is preferable that the overstretching in production thereof is less likely to occur, as well as the delamination between layers is less likely to occur. In this case, the low refractive index resin is more preferably an ethylene terephthalate polycondensate wherein a copolymerization amount of cyclohexanedimethanol is 15 mol % or more and 60 mol % or less.

Thereby, a change in optical property due to heating or time is particularly small, while having a high reflectance, so that the delamination between layers is less likely to occur. An ethylene terephthalate polycondensate wherein the copolymerization amount of cyclohexanedimethanol is in the range described above, is very strongly adhered to polyethylene terephthalate. Also, since the cyclohexanedimethanol group includes a cis form or a trans form as geometric isomers, and also includes a chair type or a boat type as conformers, an orientation crystallization is less likely to occur even when it is co-stretched with polyethylene terephthalate; has a high reflectance; a change in optical property due to a thermal history is further small; and a breakage during film formation is less likely to occur.

In the multi-layer film of the resin described above, a portion having a structure wherein a high refractive index resin layer and a low refractive index resin layer are alternately stacked in the thickness direction, may exist. That is, it is preferable that the arrangement order of the high refractive index resin layer and the low refractive index resin layer in the thickness direction is not a random state, and the arrangement order of the resin layers other than the high refractive index resin layer and the low refractive index resin layer is not particularly limited. Also, when the multi-layer film of the resin includes a high refractive index resin layer, a low refractive index resin layer, and the other resin layer, the arrangement order of these layers is more preferable that the respective layers are stacked in a regular sequence such as $A(BCA)_n$, $A(BCBA)_n$, and $A(BABCBA)_n$, when the high refractive index resin layer is regarded as "A", the low refractive index resin layer is regarded as "B", and the other resin layer is regarded as "C". Here, "n" is the number of repeating units, and when n=3 in $A(BCA)_n$, for example, it represents one stacked in the order of ABCABCABCA in the thickness direction.

Also, the stacked number of the high refractive index resin layer and the low refractive index resin layer may be appropriately adjusted so as to obtain the incident angle dependency in reflectance and transmittance described above. Specifically, 30 layers or more respective layers of the high refractive index resin layer and the low refractive index resin layer may be stacked alternately, and 200 layers or more respective layers may be stacked. The total number of stacked layers of the high refractive index resin layer and the low refractive index resin layer may be, for example, 600 layers or more. When the number of the stacked layers is too small, sufficient reflectance may not be obtained. Also, by the number of stacked layers being in the range described above, a desired reflectance may be easily obtained. Also, the upper limit of the total number of stacked layers is not particularly limited, and may be, for example, 1500 layers or less, in consideration of the increase in size of the device and the decrease in stacking accuracy due to an excessively large number of layers.

Further, it is preferable that the multi-layer film of a resin includes a surface layer including polyethylene terephthalate or polyethylene naphthalate having a thickness of 3 μm or more, on at least one surface, and among the above, it is preferable to include the surface layer on both surfaces. Also, the thickness of the surface layer is more preferably 5 μm or more. By including the surface layer, the surface of the multi-layer film of a resin may be protected.

Examples of a method for producing the multi-layer film of a resin may include a co-extrusion method. Specifically, reference may be made to a method for producing a stacked film described in Japanese Patent Application Laid-Open (JP-A) No. 2008-200861.

Further, as the multi-layer film of a resin, a commercially available stacked film may be used, and specific examples thereof may include Picassas (registered trademark) from Toray Industries, Ltd., and ESR from 3M Co., Ltd.

ii) Reflective Structure

The reflective structure includes a first reflective film in a pattern form and a second reflective film in a pattern form, in this order from the first layer side, wherein the opening of the first reflective film and the opening of the second reflective film are placed so as not to overlap in a plan view, and the first reflective film and the second reflective film are placed apart from each other in the thickness direction.

The reflective structure may be classified into two aspects. The first aspect of the reflective structure includes a transparent substrate, a first reflective film in a pattern form placed on one surface of the transparent substrate, and a second reflective film in a pattern form placed on the other surface of the transparent substrate, wherein the opening of the first reflective film and the opening of the second reflective film are placed so as not to overlap in a plan view; and the first reflective film and the second reflective film are placed apart from each other in the thickness direction. Also, the second aspect of the reflective structure includes a transparent substrate; a convex portion in a pattern form, having a light transmittivity, placed on one surface of the transparent substrate; a first reflective film in a pattern form placed on the convex portion, opposite surface side to the transparent substrate side surface; and a second reflective film in a pattern form placed on the opening of the convex portion on one surface of the transparent substrate, wherein the opening of the first reflective film and the opening of the second reflective film are placed so as not to overlap in a plan view; and the first reflective film and the second reflective film are placed apart from each other in the thickness direction. Hereinafter, each aspect will be described separately.

(First Aspect of Reflective Structure)

The first aspect of the reflective structure in the present disclosure includes a transparent substrate, a first reflective film in a pattern form placed on one surface of the transparent substrate, and a second reflective film in a pattern form placed on the other surface of the transparent substrate, wherein the opening of the first reflective film and the opening of the second reflective film are placed so as not to overlap in a plan view, and the first reflective film and the second reflective film are placed apart from each other in the thickness direction. In the case of the reflective structure in the present aspect, in the second diffusion member, the first layer is placed on the first reflective film side surface of the reflective structure.

Figure 8A:
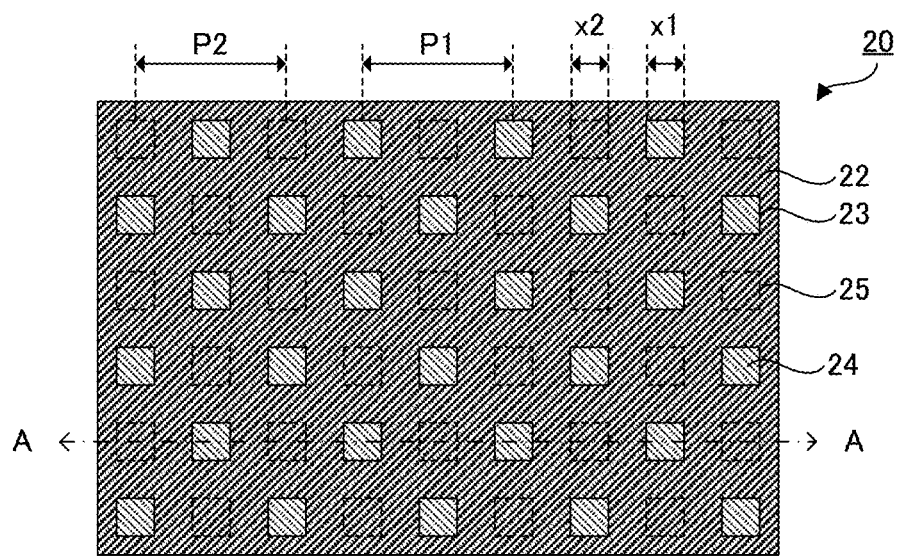
FIGS. 8A and 8B are a schematic plan view and a schematic cross-sectional view illustrating an example of the first aspect of the reflective structure of the second diffusion member.
Figure 8B:
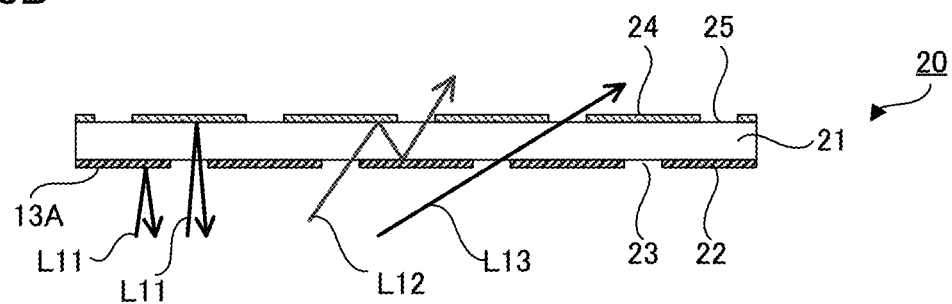

FIGS. 8A and 8B are a schematic plan view and a schematic cross-sectional view illustrating an example of a reflective structure in the present aspect; FIG. 8A is a plan view viewed from the first reflective film side surface of the reflective structure; and FIG. 8B is a line A-A cross-sectional view of FIG. 8A. As shown in FIGS. 8A and 8B, a reflective structure 20 includes a transparent substrate 21, a first reflective film 22 in a pattern form placed on one surface of the transparent substrate 21, and a second reflective film 24 placed on the other surface of the transparent substrate 21. An opening 23 of the first reflective film 22 and an opening 25 of the second reflective film 24 are placed so as not to overlap in a plan view. Also, the first reflective film 22 and the second reflective film 24 are placed on respective surfaces of the transparent substrate 21, and placed apart from each other in the thickness direction. Incidentally, in FIG. 8A, the opening of the second reflective film is indicated by a broken line.

In such reflective structure, the first reflective film and the second reflective film in a pattern form are stacked, and since the opening of the first reflective film and the opening of the second reflective film are placed so as not to overlap in a plan view, when the diffusion member including the reflective structure in the present aspect is used for a surface-emitting device, at least one of the first reflective film 22 and the second reflective film 24 will always be present at directly above the LED element. Therefore, incident light L11 with a low incident angle to the first reflective film 22 side surface of the reflective structure 20, that is, the surface 13A of the reflective structure 20 (second layer), on the side where the first layer (not shown) is placed, may be reflected by the first reflective film 22 and the second reflective film 24.

Also, since the opening of the first reflective film and the opening of the second reflective film are placed so as not to overlap in a plan view, and since the first reflective film and the second reflective film are placed apart from each other in the thickness direction, it is possible to emit incident light L12, L13 with high incident angle with respect to the first reflective film 22 side surface of the reflective structure 20, that is, the surface 13A of the reflective structure 20 (second layer), on the side wherein the first layer (not shown in the figure) is placed, from the opening 23 of the first reflective film 22 and the opening 25 of the second reflective film 24. Thereby, a part of the light emitted from the LED element, and then, emitted from the second layer side surface of the diffusion member may be emitted from a position away from the LED element in in-plane direction, rather than directly above the LED element. Therefore, in-plane uniformity of luminance may be improved.

As the first reflective film and the second reflective film, a common reflective film may be used, and for example, a metal film, and a dielectric multi-layer film may be used. As a material of the metal film, a metal material used for a common reflective film may be employed, and examples thereof may include aluminum, gold, silver, and alloys thereof. Also, as the dielectric multi-layer film, a film used for a common reflective film may be employed, and examples thereof may include a multi-layer film of an inorganic compound such as a multi-layer film wherein zirconium oxide and silicon oxide are alternately stacked. The materials included in the first reflective film and the second reflective film may be the same, and may be different from each other.

The pitch of the openings of the first reflective film and the second reflective film may be such that the incident angle dependency in reflectance and transmittance described above is obtained, and is appropriately set according to, for example, the light distribution property, size, pitch and shape of the LED element in the surface-emitting device wherein the diffusion member in the present aspect is used, and the distance between the LED substrate and the diffusion member. The pitch of the opening of the first reflective film and the second reflective film may be the same, and may be different from each other.

The pitch of the opening of the first reflective film may be larger than the size of the LED element, for example. Specifically, the pitch of the opening of the first reflective film may be 0.1 mm or more and 20 mm or less.

Also, the pitch of the opening of the second reflective film is not particularly limited as long as it may suppress luminance unevenness, and among the above, it is preferable that the pitch is equal to or less than the pitch of the opening of the first reflective film, and it is preferable that the pitch is less than the pitch of the opening of the first reflective film. Specifically, the pitch of the opening of the second reflective film may be 0.1 mm or more and 2 mm or less. By making the pitch of the opening of the second reflective film as fine as described above, the pattern of the second reflective film portion and the opening portion of the second reflective film may be made difficult to visually recognize, so that a surface emission without unevenness is possible.

Incidentally, the pitch of the openings of the first reflective film refers to distance "P1" between the centers of adjacent openings 23 of the first reflective film 22 as shown in FIG. 8A for example. Also, the pitch of the openings of the second reflective film refers to distance "P2" between the centers of adjacent openings 25 of the second reflective film 24 as shown in FIG. 8A for example.

The size of the openings of the first reflective film and the second reflective film may be such that the incident angle dependency in reflectance and transmittance described above is obtained, and is appropriately set according to, for example, the light distribution property, size, pitch and shape of the LED element, and the distance between the LED substrate and the diffusion member. The size of the openings of the first reflective film and the second reflective film may be the same, and may be different from each other.

As the size of the opening of the first reflective film, specifically, when the shape of the opening of the first reflective film is a rectangular shape, the length of the opening of the first reflective film may be 0.1 mm or more and 5 mm or less.

Also, the size of the opening of the second reflective film is not particularly limited as long as it may suppress luminance unevenness, and among the above, it is preferable that the size is equal to or less than the size of the opening of the first reflective film, and it is preferable that the size is less than the size of the opening of the first reflective film. Specifically, when the shape of the opening of the second reflective film is a rectangular shape, the length of the opening of the second reflective film may be 0.05 mm or more and 2 mm or less. By making the size of the opening of the second reflective film as fine as described above, the pattern of the second reflective film portion and the opening portion of the second reflective film may be made difficult to visually recognize, so that a surface emission without unevenness is possible.

Incidentally, when the shape of the opening of the first reflective film is a rectangular shape, the size of the opening of the first reflective film refers to, for example, length "x1" of opening 23 of first reflective film 22 as shown in FIG. 8A. Also, the size of the opening of the second reflective film refers to, for example, length "x2" of opening 25 of second reflective film 24 as shown in FIG. 8A.

The opening of the first reflective film and the second reflective film may have any shape, such as a rectangular shape, and a circular shape. The thicknesses of the first reflective film and the second reflective film may be appropriately adjusted such that the incident angle dependency in reflectance and transmittance described above is obtained. Specifically, the thickness of the first reflective film and the second reflective film may be 0.05 µm or more and 100 µm or less.

The first reflective film and the second reflective film may be formed on the surface of the transparent substrate, and may be sheet shaped reflective films. A method for forming the first reflective film and the second reflective film is not particularly limited as long as a reflective film in a pattern form may be formed on the surface of the transparent substrate, and examples thereof may include a sputtering method, and a vacuum deposition method. Also, when the first reflective film and the second reflective film are sheet shaped reflective films, examples of a method for forming an opening may include a method wherein a plurality of through holes are formed by, for example, a punching process. In this case, as a method for stacking the transparent substrate and the sheet shaped reflective film, for example, a method wherein a sheet shaped reflective film is adhered to a transparent substrate via an adhesive layer or a pressure-sensitive adhesive layer, may be used.

The transparent substrate in the reflective structure in the present aspect is a member configured to support, for example, the first reflective film, and the second reflective film described above, and is a member configured to place the first reflective film and the second reflective film apart from each other in the thickness direction.

The transparent substrate has light transmittivity. As the light transmittivity of the transparent substrate, the total light transmittance of the transparent substrate is preferably, for example, 80% or more, and among the above, preferably 90% or more.

Incidentally, the total light transmittance of the transparent substrate may be measured, for example, by a method according to JIS K7361-1:1997.

As a material constituting the transparent substrate, any material having the total light transmittance described above may be used, and examples thereof may include resins such as polyethylene terephthalate, polycarbonate, acrylic, cycloolefin, polyester, polystyrene, and acrylic styrene; and glasses such as quartz glass, Pyrex (registered trade name), and synthetic quartz.

As shown in FIG. 8B for example, the thickness of the transparent substrate is preferably a thickness such that incident light L12 with high incident angle with respect to the first reflective film 22 side surface of the reflective structure 20, that is, the surface 13A of the side wherein the first layer (not shown in the figure) of the reflective structure 20 (second layer) is placed, may be emitted from the opening 23 of the first reflective film 22 and the opening 25 of the second reflective film 24. The thickness of the transparent substrate is appropriately set according to, for example, the pitch and the size of the openings of the first reflective film and the second reflective film, and the thickness of the first reflective film and the second reflective film. Specifically, the lower limit value of the thickness of the transparent substrate may be 0.05 mm or more, and among them, preferably 0.1 mm or more. Meanwhile, the upper limit value of the thickness may be 2 mm or less, and among them, preferably 0.1 mm or more and 0.5 mm or less.

(Second Aspect of Reflective Structure)

The second aspect of the reflective structure includes a transparent substrate; a convex portion in a pattern form, having a light transmittivity, placed on one surface of the transparent substrate; a first reflective film in a pattern form placed on the convex portion, opposite surface side to the transparent substrate side surface; and a second reflective film in a pattern form placed on the opening of the convex portion on one surface of the transparent substrate, wherein the opening of the first reflective film and the opening of the second reflective film are placed so as not to overlap in a plan view; and the first reflective film and the second reflective film are placed apart from each other in the thickness direction. In the case of the reflective structure in the present aspect, in the second diffusion member, the first layer is placed on the first reflective film side surface of the reflective structure.

Figure 9A:
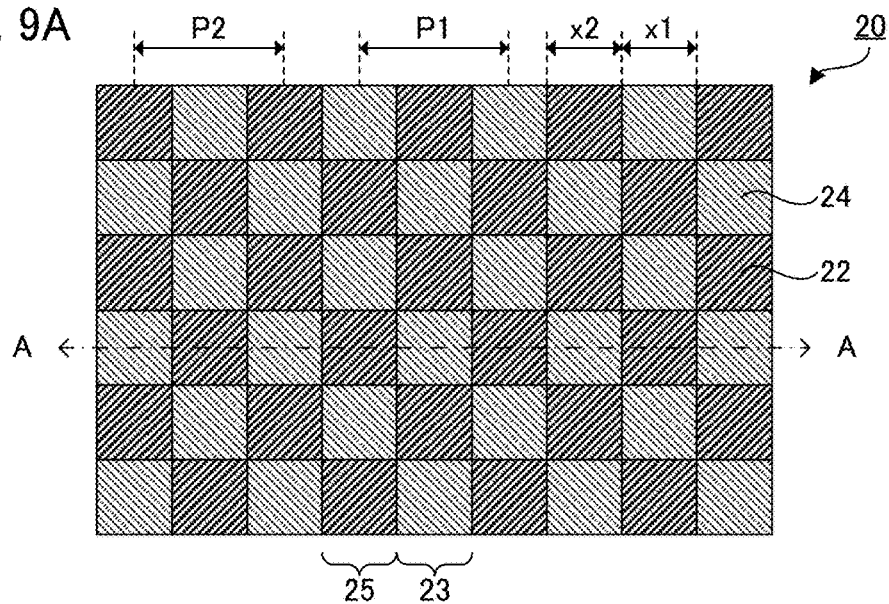
FIGS. 9A and 9B are a schematic plan view and a schematic cross-sectional view illustrating an example of the second aspect of the reflective structure of the second diffusion member.
Figure 9B:
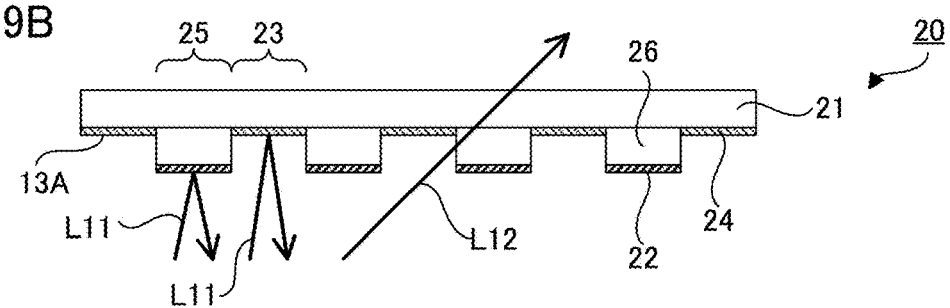

FIGS. 9A and 9B are a schematic plan view and a schematic cross-sectional view illustrating an example of the second aspect of the reflective structure in the present disclosure, FIG. 9A is a plan view viewed from the first reflective film side surface of the reflective structure, and FIG. 9B is a line A-A cross-sectional view of FIG. 9A. As shown in FIGS. 9A and 9B, a reflective structure 20 includes a transparent substrate 21; a convex portion 26 in a pattern form, having a light transmittivity, placed on one surface of the transparent substrate 21; a first reflective film 22 in a pattern form placed on the opposite surface to the transparent substrate 21 side surface of the convex portion 26; and a second reflective film 24 in a pattern form placed on the opening of the convex portion 26 on one surface of the transparent substrate 21. The opening 23 of the first reflective film 22 and the opening 25 of the second reflective film 24 are placed so as not to overlap in a plan view. Also, the first reflective film 22 and the second reflective film 24 are separated by the convex portion 26, and are placed apart from each other in the thickness direction.

In such reflective structure, the first reflective film and the second reflective film in a pattern form are stacked, and since the opening of the first reflective film and the opening of the second reflective film are placed so as not to overlap in a plan view, in the surface-emitting device (particularly LED backlight) using the diffusion member including the reflective structure in the present aspect, at least one of the first reflective film and the second reflective film will always be present at directly above the LED element. Therefore, similar to the reflective structure of the first aspect, as shown in FIG. 9B for example, it is possible to reflect incident light L11 with low incident angle with respect to the first reflective film 22 side surface of the reflective structure 20, that is, the surface 13A of the side wherein the first layer (not shown in the figure) of the reflective structure 20 (second layer) is placed, by the first reflective film 22 and the second reflective film 24.

Also, since the opening of the first reflective film and the opening of the second reflective film are placed so as not to overlap in a plan view, and since the first reflective film and the second reflective film are placed apart from each other in the thickness direction, it is possible to emit incident light L12 with high incident angle with respect to the first reflective film 22 side surface of the reflective structure 20, that is, the surface 13A of the side wherein the first layer (not shown in the figure) of the reflective structure 20 (second layer) is placed, from the side surface of the convex portion 26 and the opening 25 of the second reflective film 24. Thereby, a part of the light emitted from the LED element, and then, emitted from the second layer side surface of the diffusion member may be emitted from a position away from the LED element in in-plane direction, rather than directly above the LED element. Therefore, in-plane uniformity of luminance may be improved. Also, in the present aspect, since the convex portion is provided, a self-alignment of the openings of the first reflective film and the second reflective film is possible, and the production cost may be reduced.

Incidentally, the materials of the first reflective film and the second reflective film; the pitch of the openings of the first reflective film and the second reflective film; the sizes of the openings of the first reflective film and the second reflective film; the shape of the openings of the first reflective film and the second reflective film; the thickness of the first reflective film and the second reflective film; and the method for forming the first reflective film and the second reflective film, may be similar to the first aspect described above.

Also, the transparent substrate may be similar to the first aspect described above.

The convex portion in the reflective structure in the present aspect is a member configured to place the first reflective film and the second reflective film apart from each other in the thickness direction. The convex portion has a light transmittivity. As the light transmittivity of the convex portion, the total light transmittance of the convex portion is preferably, for example, 80% or more, and among them, preferably 90% or more. Incidentally, the total light transmittance of the convex portion may be measured, for example, by a method according to JIS K7361-1:1997.

As a material constituting the convex portion, any material wherein a convex portion in a pattern form may be formed, and having the total light transmittance described above may be used, and examples thereof may include a thermosetting resin and an electron beam curable resin.

As shown in FIG. 9B for example, the height of the convex portion is preferably a height such that it is possible to emit incident light L12 with high incident angle with respect to the first reflective film 22 side surface of the reflective structure 20, that is, the surface 13A of the side wherein the first layer (not shown in the figure) of the reflective structure 20 (second layer) is placed, from the side surface of the convex portion 26 and the opening 25 of the second reflective film 24; and it is appropriately set according to, for example, the pitch and size of the openings of the first reflective film and the second reflective film, and the thickness of the first reflective film and the second reflective film. Specifically, the lower limit value of the height of the convex portion may be 0.05 mm or more, and among them, preferably 1 mm or more. Meanwhile, the upper limit value of the height of the convex portion may be 2 mm or less, and among them, preferably 0.5 mm or less.

Figure 10A:
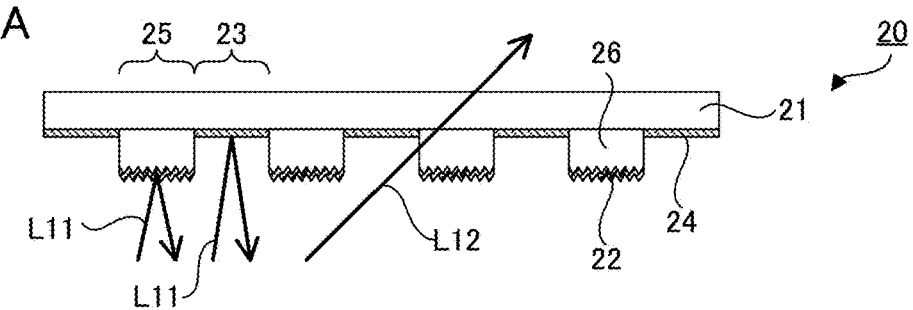
FIGS. 10A and 10B are schematic cross-sectional views illustrating another example of the second aspect of the reflective structure of the second diffusion member.

The pitch, the size, and the plan view shape of the convex portion may be similar to the pitch, the size, and the shape of the opening of the second reflective film. The surface of the convex portion may be a smooth surface as shown in FIG. 9B for example, and may be a rough surface as shown in FIG. 10A. When the surface of the convex portion is a rough surface, it is possible to impart light diffusivity to the convex portion.

Figure 10B:
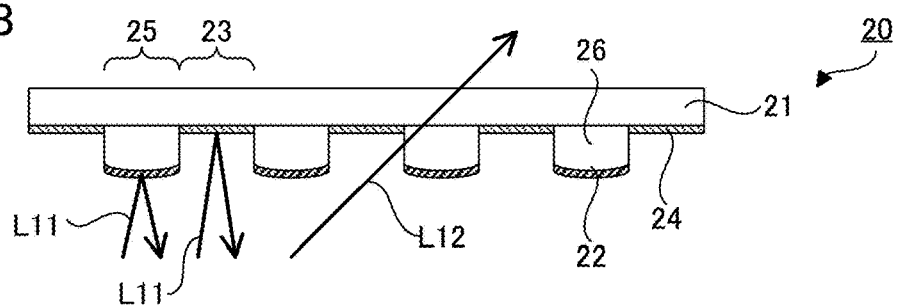

Also, the shape of the surface of the convex portion may be a flat surface as shown in FIG. 9B for example, and may be a curved surface as shown in FIG. 10B. When the surface of the convex portion is curved, it is possible to impart light diffusivity to the convex portion.

The method for forming the convex portion is not particularly limited as long as it is a method capable of forming a convex portion in a pattern form, and examples thereof may include a printing method, and a resin shaping by a mold.

iii) Reflection-Type Diffraction Grating

When the second layer is a reflection-type diffraction grating, the reflection-type diffraction grating is not particularly limited as long as it has the incident angle dependency in reflectance and transmittance described above.

The pitch, for example, of the reflection-type diffraction grating may be appropriately adjusted so as to obtain the incident angle dependency in reflectance and transmittance described above. Specifically, when the wavelength of the light output by the LED element is a single color such as red, green, and blue, the light from the LED element may be effectively reflected by setting the pitch according to the respective wavelengths.

As the material constituting the reflection-type diffraction grating, any material capable of obtaining a reflection-type diffraction grating having the incident angle dependency in reflectance and transmittance described above, may be used, and a material commonly used for a reflection-type diffraction grating may be employed. Also, the method for forming a reflection-type diffraction grating may be similar to a method for forming a common reflection-type diffraction grating.

(3) Third Diffusion Member

Examples of the third diffusion member may include a resin plate including a light transmitting resin such as polystyrene (PS) and polycarbonate, including a number of voids inside thereof, or including convexoconcave on the surface thereof, and those commonly used in the display device field may be used.

(4) Wavelength Conversion Member

In the surface-emitting device in the present disclosure, for example, a wavelength conversion member may be placed on the diffusion member, on opposite surface side to the LED substrate side, and a wavelength conversion member may be placed on the LED substrate side of the diffusion member.

The wavelength conversion member is a member that includes a fluorescent substance that absorbs light emitted from the LED element and emits excitation light. The wavelength conversion member has a function of generating white light by being combined with the LED substrate.

The wavelength conversion member usually includes at least a wavelength conversion layer including a fluorescent substance and a resin.

The wavelength conversion member may be, for example, a wavelength conversion layer alone, and may be a stacked body including a wavelength conversion layer on one surface side of a transparent substrate. Among them, a wavelength conversion layer alone is preferable from the viewpoint of the reduction of the thickness. More preferably, a sheet shaped wavelength conversion member is used.

The fluorescent substance may be appropriately selected according to the emission color from the LED element; and examples thereof may include a blue fluorescent substance, a green fluorescent substance, a red fluorescent substance, and a yellow fluorescent substance. For example, when the LED element is a blue LED element, a green fluorescent substance and a red fluorescent substance may be used as the fluorescent substance, and a yellow fluorescent substance may be used. Also, for example, when the LED element is an ultraviolet LED element, a red fluorescent substance, a green fluorescent substance, and a blue fluorescent substance may be used as the fluorescent substance.

For example, a fluorescent substance used for a wavelength conversion member of a LED backlight may be employed as the fluorescent substance. The quantum dots may also be used as the fluorescent substance. The content of the fluorescent substance in the wavelength conversion member layer is not particularly limited as long as it may generate a desired white light, and may be similar to the content of the fluorescent substance in a wavelength conversion member in a common LED backlight.

Further, the resin included in the wavelength conversion member is not particularly limited as long as the fluorescent substance may be dispersed. The resin may be similar to a resin used for a wavelength conversion member in a common LED backlight, and examples thereof may include a thermosetting resin such as a silicone based resin and an epoxy based resin.

The thickness of the wavelength conversion member is not particularly limited as long as the thickness may generate a desired white light when used for a surface-emitting device, and may be, for example, 10 μm or more and 1000 μm or less.

(5) Other Optical Members

In the surface-emitting device in the present disclosure, for example, an optical member may further be placed on the diffusion member, on opposite surface side to the LED substrate side surface. Examples of the optical member may include a prism sheet, and a reflection-type polarizing sheet.

a) Prism Sheet

The prism sheet in the present disclosure has a function of collecting the incident light and intensively improving the luminance in the front direction. The prism sheet, for example, is one wherein a prism pattern including an acrylic resin, for example, is placed on one surface side of a transparent resin substrate. As the prism sheet, for example, a BEF series luminance improving film from 3M Corporation may be used.

b) Reflection-Type Polarizing Sheet

The reflection-type polarizing sheet in the present disclosure has a function of transmitting only the first linearly polarized light component (such as P-polarized light) and reflecting, without absorbing, the second linearly polarized light component (such as S-polarized light) orthogonal to the first linearly polarized light component. The second linearly polarized light component reflected by the reflection-type polarizing sheet is reflected again, and enters again into the reflection-type polarizing sheet in a condition wherein the polarization is resolved (a condition including both the first linearly polarized light component and the second linearly polarized light component). Therefore, the reflection-type polarizing sheet transmits the first linearly polarized light component among the light incident again, and the second linearly polarized light component orthogonal to the first linearly polarized light component is reflected again.

Thereafter, by repeating the above process, approximately 70% to 80% of the light emitted from the second layer is emitted as the light of the first linearly polarized light component. Therefore, when the surface-emitting device in the present disclosure is used in a display device, all the light emitted from the surface-emitting device is usable for imaging in a display panel, by matching the polarization direction of the first linearly polarized light component (transmission axis component) of the reflection-type polarizing sheet and the transmission axis direction of the polarizing plate of the display panel. Thus, even when the input light energy from the LED element is the same, a higher luminance image may be formed as compared with the case where the reflection-type polarizing sheet is not placed.

Examples of the reflection-type polarizing sheet may include a luminance improving film DBEF series from 3M Corporation. Further, as the reflection-type polarizing sheet, for example, a high luminance polarizing sheet WRPS from Shinwha Intertek Corporation, and a wire grid polarizer may be used.

4. Use Application

The application of the surface-emitting device in the present disclosure is not particularly limited, and may be suitably used for a display device. Also, it may be used for, for example, an illuminating device.

B. Display Device

The present disclosure provides a display device comprising a display panel; and the surface-emitting device described above placed on a rear surface of the display panel.

Figure 11:
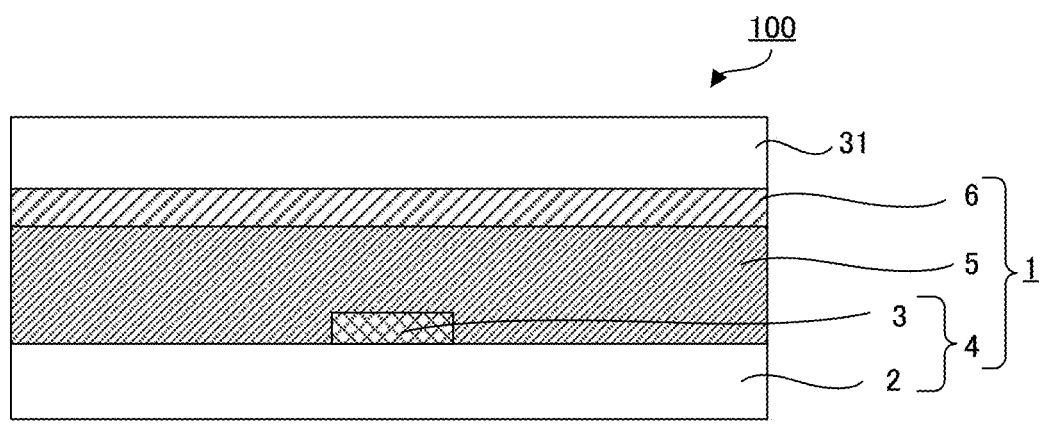
FIG. 11 is a schematic view illustrating an example of a display device in the present disclosure.
Figure 12A:
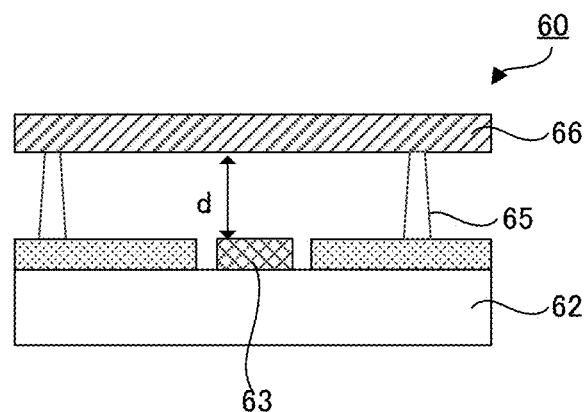
Figure 12A:
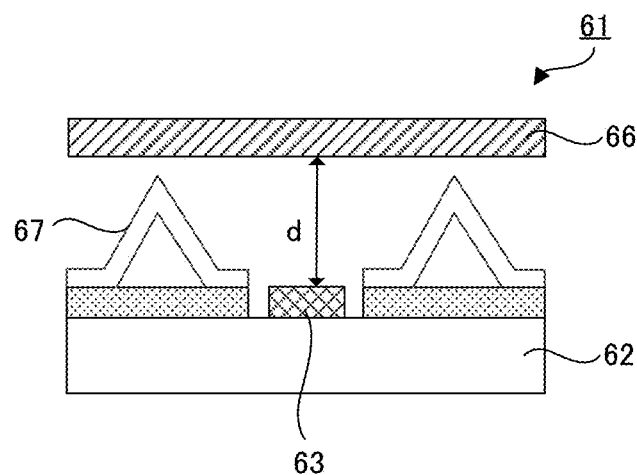
Figure 12A:
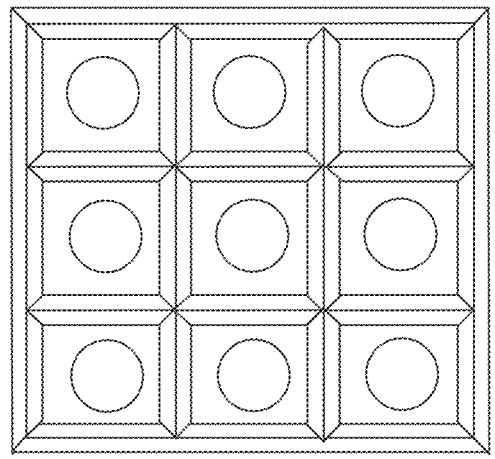

FIG. 11 is a schematic view illustrating an example of a display device in the present disclosure. As shown in FIG. 11, a display device 100 comprises a display panel 31; and the surface-emitting device 1 in the present disclosure placed on the rear surface of the display panel 31.

According to the present disclosure, by including the surface-emitting device described above, the in-plane uniformity of luminance may be improved while reducing the thickness. Therefore, a high quality display device may be obtained.

1. Surface-Emitting Device

The surface-emitting device in the present disclosure is similar to those described in the section "A. Surface-emitting device" above.

2. Display Panel

The display panel in the present disclosure is not particularly limited, and examples thereof may include a liquid crystal panel.

Incidentally, the present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

Experimental Examples in relation to the sealing member are hereinafter shown, and then, Examples and Comparative Examples in the present disclosure are shown, and the present disclosure is explained in further details.

A. Experimental Examples

Experimental Example 1

As shown in FIG. 1, a surface-emitting device 1 comprising a light-emitting diode substrate 4 including a supporting substrate 2, and a light-emitting diode element 3; a sealing member A (thickness: 450 μm) 5; a diffusion member A6; and a wavelength conversion member, was produced. The haze value, the layer structure, the density, and the transmittance at wavelength of 450 nm of the sealing member A are shown in Table 1. The evaluation result of the luminance unevenness evaluated by the following method is shown in Table 2.

The members used herein were as follows.
Light-Emitting Diode Substrate

LED chip B0815ACQ0 (chip size of 0.2 mm×0.4 mm, from Gene Lite Inc.) were tetragonally arranged on a supporting substrate (reflectance of 95%) with a pitch of 6 mm. Here, tetragonally arrangement refers to an arrangement of LED chips arranged in a grid pattern.
Diffusion Member a (Diffusion Plate)

55K3 (from Entire Technology Co., Ltd.)
Wavelength Conversion Member (QD)

QF-6000 (from Showa Denko Materials Pte. Ltd.)

Incidentally, the thickness of the sealing member and the optical properties shown in Table 1 were values obtained by sandwiching the sealing member sheet between ETFE films (thickness of 100 μm), heat treating by a vacuum lamination, and then, measuring the sample for a sealing member. The measurements of the optical properties were carried out by peeling the ETFE films so as to measure only the sample for sealing member. The vacuum lamination conditions were as follows.
(Vacuum Lamination Conditions)
  (a) Vacuum suction: 5.0 minutes
  (b) Pressure application: pressurized from 0 kPa to 100 kPa in 5 seconds
  (c) Pressure maintaining: (100 kPa): 7 minutes
  (d) Temperature: 150° C.

Experimental Example 2

The luminance unevenness was evaluated in the same manner as in Example 1, except that, instead of the diffusion member A, the following diffusion member B was used. The results are shown in Table 2.
Diffusion Member B A second diffusion member including a prism structure wherein a prism surface was formed on the light-emitting diode element side, as the first layer, and a dielectric multi-layer film as the second layer.

Experimental Examples 3, 4

The luminance unevenness was evaluated in the same manner as in Examples 1 and 2, except that, instead of the sealing member A, the following sealing member B (thickness: 450 μm) shown in Table 1 was used. Incidentally, the thickness ratio of the skin layer and the core layer was 0.18, when skin layer/core layer. The thickness ratio was the same for the sealing member D to sealing member K shown below.

Experimental Examples 5, 6

The luminance unevenness was evaluated in the same manner as in Examples 1 and 2, except that, instead of the sealing member A, sealing member D (thickness: 450 μm) shown in Table 1 was used.

Experimental Examples 7, 8

The luminance unevenness was evaluated in the same manner as in Examples 1 and 2, except that, instead of the sealing member A, sealing member E shown in Table 1 (thickness: 450 μm) was used.

For the sealing member E, KS340T (product name, biomass polyethylene content: 0% by mass) from Japan Polyethylene Corporation was used as the skin layer, and SEB853 (product name, biomass polyethylene content: 95% by mass) from Braskem S. A. was used as the core layer. The biomass polyethylene content as the sealing member was 74% by mass.

Experimental Examples 9, 10

The luminance unevenness was evaluated in the same manner as in Examples 1 and 2, except that, instead of the sealing member A, sealing member F shown in Table 1 (thickness: 450 μm) was used.

For the sealing member F, KS340T (product name, biomass polyethylene content: 0% by mass) from Japan Polyethylene Corporation was used as the skin layer, and SLL118 (product name, biomass polyethylene content: 87% by mass) from Braskem S. A. was used as the core layer. The biomass polyethylene content as the sealing member was 68% by mass.

Experimental Examples 11, 12

The luminance unevenness was evaluated in the same manner as in Examples 1 and 2, except that, instead of the sealing member A, sealing member G shown in Table 1 (thickness: 450 μm) was used.

For the sealing member G, SLL118 (product name, biomass polyethylene content: 87% by mass) from Braskem S. A. was used as the skin layer, and Sumikathene L420 (product name, biomass polyethylene content: 0% by mass) from Sumitomo Chemical Co., Ltd. was used as the core layer. The biomass polyethylene content as the sealing member was 19% by mass.

Experimental Examples 13, 14

The luminance unevenness was evaluated in the same manner as in Example 1 and 2, except that, instead of the sealing member A, sealing member H shown in Table 1 (thickness: 450 μm) was used.

For the sealing member H, SLL118 (product name, biomass polyethylene content: 87% by mass) from Braskem S. A. was used as the skin layer, and SEB853 (product name, biomass polyethylene content: 95% by mass) from Braskem S. A. was used as the core layer. The biomass polyethylene content as the sealing member was 93% by mass.

Experimental Examples 15, 16

The luminance unevenness was evaluated in the same manner as in Examples 1 and 2, except that, instead of the sealing member A, sealing member I shown in Table 1 (thickness: 450 μm) was used. Incidentally, the skin layer was used on the LED chip side.

For the sealing member I, KS340T (product name, biomass polyethylene content: 0% by mass) from Japan Polyethylene Corporation was used as the skin layer, and SEB853 (product name, biomass polyethylene content: 95% by mass) from Braskem S. A. was used as the core layer. The biomass polyethylene content as the sealing member was 84% by mass.

Experimental Examples 17, 18

The luminance unevenness was evaluated in the same manner as in Examples 1 and 2, except that, instead of the sealing member A, sealing member J shown in Table 1 (thickness: 450 μm) was used. Incidentally, the skin layer was used on the LED chip side.

For the sealing member J, SLL118 (product name, biomass polyethylene content: 87% by mass) from Braskem S. A. was used as the skin layer, and SEB853 (product name, biomass polyethylene content: 95% by mass) from Braskem S. A. was used as the core layer. The biomass polyethylene content as the sealing member was 94% by mass.

Experimental Examples 19, 20

The luminance unevenness was evaluated in the same manner as in Examples 1 and 2, except that, instead of the sealing member A, sealing member K shown in Table 1 (thickness: 450 μm) was used. Incidentally, the skin layer was used on the LED chip side.

For the sealing member K, KS340T (product name, biomass polyethylene content: 0% by mass) from Japan Polyethylene Corporation was used as the skin layer, and SLL118 (product name, biomass polyethylene content: 87% by mass) from Braskem S. A. was used as the core layer. The biomass polyethylene content as the sealing member was 77% by mass.

Comparative Experimental Examples 1, 2

The luminance unevenness was evaluated in the same manner as in Examples 1 and 2, except that, instead of the sealing member A, pins were provided between the diffusion member and the light-emitting diode substrate. The results are shown in Table 2. In doing so, the distance between the light-emitting diode element and the diffusion member was 500 μm.

Comparative Experimental Examples 3, 4

The luminance unevenness was evaluated in the same manner as in Examples 1 and 2, except that, instead of the sealing member A, a Si cured product (thickness of 450 μm) using a liquid silicone composition of a high-transparent potting type was provided. The results are shown in Table 2.

Comparative Experimental Examples 5, 6

The luminance unevenness was evaluated in the same manner as in Examples 1 and 2, except that, instead of the sealing member A, sealing member C shown in Table 1 (thickness: 450 μm) was used. The results are shown in Table 2.

TABLE 1

|  | Haze value [%] | Layer structure | Density [g/cm³] | Transmittance [%] |
|---|---|---|---|---|
| Sealing member A | 15 | Single layer | 0.901 | 85 |
| Sealing memberB | 15 | 2 types, 3 layers | Skin layer: 0.880 Core layer: 0.919 | 83 |
| Sealing memberC | 1.9 | Single layer | 0.88 | 90 |
| Sealing memberD | 4.3 | 2 types, 3 layers | Skin layer: 0.880 Core layer: 0.919 | 89 |
| Sealing memberE | 15 | 2 types, 3 layers | Skin layer: 0.880 Core layer: 0.923 | 82 |
| Sealing memberF | 10 | 2 types, 3 layers | Skin layer: 0.880 Core layer: 0.916 | 88 |
| Sealing memberG | 14 | 2 types, 3 layers | Skin layer: 0.916 Core layer: 0.919 | 82 |
| Sealing memberH | 13 | 2 types, 3 layers | Skin layer: 0.916 Core layer: 0.923 | 82 |
| Sealing member I | 18 | 2 types, 2 layers | Skin layer: 0.880 Core layer: 0.923 | 80 |
| Sealing memberJ | 19 | 2 types, 2 layers | Skin layer: 0.916 Core layer: 0.923 | 80 |
| Sealing memberK | 8 | 2 types, 2 layers | Skin layer: 0.880 Core layer: 0.916 | 90 |

[Luminance Unevenness Evaluation Method]

The luminance of the obtained surface-emitting device, at the time of LED emitting, was measured using a two-dimensional color luminance meter CA2000 to evaluate the luminance unevenness. The luminance unevenness was determined as follows using uniformity value as indexes.

[Evaluation Criteria]

Uniformity=minimum value of front luminance/ maximum value of front luminance

A: uniformity was 0.9 or more

B: uniformity was 0.8 or more and less than 0.9

C: uniformity was less than 0.8

TABLE 2

|  | Supporting member | Diffusion member | Luminance unevenness evaluation |
|---|---|---|---|
| ExperimentalEx. 1 | Sealing memberA | Diffusion memberA | A |
| ExperimentalEx. 2 | Sealing memberA | Diffusion memberB | A |
| ExperimentalEx. 3 | Sealing memberB | Diffusion memberA | A |
| ExperimentalEx. 4 | Sealing memberB | Diffusion memberB | A |
| ExperimentalEx. 5 | Sealing memberD | Diffusion memberA | A |
| ExperimentalEx. 6 | Sealing memberD | Diffusion memberB | A |
| ExperimentalEx. 7 | Sealing memberE | Diffusion memberA | A |
| ExperimentalEx. 8 | Sealing memberE | Diffusion memberB | A |
| ExperimentalEx. 9 | Sealing memberF | Diffusion memberA | A |
| ExperimentalEx. 10 | Sealing memberF | Diffusion memberB | A |
| ExperimentalEx. 11 | Sealing memberG | Diffusion memberA | A |
| ExperimentalEx. 12 | Sealing memberG | Diffusion memberB | A |
| ExperimentalEx. 13 | Sealing memberH | Diffusion memberA | A |
| ExperimentalEx. 14 | Sealing memberH | Diffusion memberB | A |
| ExperimentalEx. 15 | Sealing member I | Diffusion memberA | A |
| ExperimentalEx. 16 | Sealing member I | Diffusion memberB | A |
| ExperimentalEx. 17 | Sealing member J | Diffusion memberA | A |

TABLE 2-continued

|  | Supporting member | Diffusion member | Luminance unevenness evaluation |
|---|---|---|---|
| ExperimentalEx. 18 | Sealing member J | Diffusion memberB | A |
| ExperimentalEx. 19 | Sealing memberK | Diffusion memberA | A |
| ExperimentalEx. 20 | Sealing memberK | Diffusion memberB | A |
| Comp. ExperimentalEx. 1 | Pin | Diffusion memberA | B |
| Comp. ExperimentalEx. 2 | Pin | Diffusion memberB | B |
| Comp. ExperimentalEx. 3 | Liquid Si | Diffusion memberB | B |
| Comp. ExperimentalEx. 4 | Liquid Si | Diffusion memberB | B |
| Comp. ExperimentalEx. 5 | Sealing memberC | Diffusion memberA | C |
| Comp. ExperimentalEx. 6 | Sealing memberC | Diffusion memberB | C |

The surface-emitting devices in the present disclosure (Examples 1 to 20) were able to suppress the luminance unevenness, while in Comparative Experimental Examples 1 and 2 wherein pins were provided; Comparative Experimental Examples 3 and 4 wherein a cured product of liquid Si was used; and Comparative Experimental Examples 5 and 6 wherein a sealing member C with low haze value was used, instead of sealing member A, the luminance unevenness could not be suppressed.

B. Example

Example 1

As shown in FIG. 3A, a LED substrate, including a LED bare chip placed on a supporting substrate, was prepared.

The 0815TCQ0 S44D/45A/B/C/D-4C/4D/5A/5B (0815 model) (from GeneLite Inc.) was used as the LED bare chip. As the supporting substrate, a stacked body including a reflective sheet (QE59 (from Toray Industries Inc.), thickness: 60 μm, reflectance: 97%), subjected to a hole cutting processing to make an opening at a LED portion, stacked on a resin substrate, was used, and the LED bare chips were placed at 4 mm pitch to produce a LED substrate.

As shown in FIG. 3B, a LED substrate A wherein the LED bare chips were sealed with the sealing member was produced by crimping the sealing member sheet onto the LED substrate as shown in FIG. 3B. The sealing member B used in the Experimental Example described above was used as the sealing member.

The transparent substrate of the LED bare chip was sapphire, and the refractive index was 1.76. Also, the refractive index of the sealing member B was 1.48. The coverage, by the sealing member, of the side surface and the surface, opposite side to the surface where the light-emitting layer is formed, of the transparent substrate of the LED bare chip, was 100%.

Incidentally, as for the method for measuring the coverage, a method similar to the method described in the section "A. Surface-emitting device, 1. LED substrate, (1) LED bare chip, a) Transparent substrate" was used.

Comparative Example 1

Using a LED bare chip and a supporting substrate including a reflective sheet stacked thereon similar to that in Example 1, a LED substrate B including the LED bare chip placed on the supporting substrate, was formed.

(Evaluation)

Using the LED substrate A sealed by the sealing member, and the LED substrate B, the light extraction efficiency was measured.

The method for measurement was as follows.

The average luminance of a fixed area of 30 mm was measured from the front surface using a two-dimensional color luminance meter CA2000 (from Konica Minolta Inc.). The distance from the objective lens to the substrate surface was 30 cm.

As the result of the measurement, when the light extraction efficiency of the LED substrate B was regarded as 100%, the light extraction efficiency of the LED substrate A sealed with the sealing member was 110%.

Incidentally, the present disclosure provides, for example, the following inventions.

[1]

A surface-emitting device comprising:

a light-emitting diode substrate including a supporting substrate, and a light-emitting diode element placed on one surface side of the supporting substrate; and a sealing member placed on a light-emitting diode element side surface of the light-emitting diode substrate, and configured to seal the light-emitting diode element;

wherein the light-emitting diode element includes a transparent substrate including inorganic material, and a light-emitting layer formed on one surface of the transparent substrate;

the light-emitting diode element is a bare chip in which the transparent substrate is exposed on a surface thereof;

the sealing member is in contact with the transparent substrate on a side surface and a surface opposite side to a surface where the light-emitting layer is formed; and a haze value of the sealing member is 4% or more, and a thickness thereof is thicker than a thickness of the light-emitting diode element.

[2]

The surface-emitting device according to [1], wherein the sealing member is in contact with 90% or more of the side surface of the transparent substrate.

[3]

The surface-emitting device according to [1] or [2], wherein the transparent substrate includes sapphire ($Al_2O_3$).

[4]

The surface-emitting device according to any one of [1] to [3], wherein the thickness of the sealing member is 50 μm or more and 800 μm or less.

[5]

The surface-emitting device according to any one of [1] to [4], wherein the sealing member includes a thermoplastic resin.

[6]

The surface-emitting device according to any one of [1] to [5], wherein the sealing member includes a polyethylene based resin with a density of 0.870 g/cm³ or more and 0.930 g/cm³ or less as a base resin.

[7]

The surface-emitting device according to any one of [1] to [6], wherein the sealing member includes a core layer, and a skin layer placed on at least one surface side of the core layer.

[8]

The surface-emitting device according to any one of [1] to [7] comprising a diffusion member placed on the sealing member, on a surface opposite to the light-emitting diode substrate.

[9]

A display device comprising a display panel; and the surface-emitting device according to any one of [1] to [8] placed on a rear surface of the display panel.

REFERENCE SIGNS LIST

1, 10: surface-emitting device
2: supporting substrate
3: LED element (LED bare chip)
4: LED substrate
5: sealing member
6: diffusion member
100: display device

The invention claimed is:

1. A surface-emitting device comprising:
 a light-emitting diode substrate including a supporting substrate, and a light-emitting diode element placed on one surface side of the supporting substrate; and
 a sealing member placed on a light-emitting diode element side surface of the light-emitting diode substrate, and configured to seal the light-emitting diode element;
 wherein the light-emitting diode element includes a transparent substrate including inorganic material, and a light-emitting layer formed on one surface of the transparent substrate;
 the light-emitting diode element is a bare chip in which the transparent substrate is exposed on a surface thereof;
 the sealing member is in contact with the transparent substrate on a side surface and a surface opposite side to a surface where the light-emitting layer is formed;
 a haze value of the sealing member is 4% or more, and a thickness thereof is thicker than a thickness of the light-emitting diode element,
 the sealing member includes polyethylene based resins or polypropylene based resins; and
 the sealing member is in contact with 90% or more of the side surface of the transparent substrate.

2. The surface-emitting device according to claim 1, wherein the transparent substrate includes sapphire ($Al_2O_3$).

3. The surface-emitting device according to claim 1, wherein the thickness of the sealing member is 50 μm or more and 800 μm or less.

4. The surface-emitting device according to claim 1, wherein the sealing member includes a polyethylene based resin with a density of 0.870 g/cm³ or more and 0.930 g/cm³ or less as a base resin.

5. The surface-emitting device according to claim 1, wherein the sealing member includes a core layer, and a skin layer placed on at least one surface side of the core layer.

6. The surface-emitting device according to claim 1 comprising a diffusion member placed on the sealing member, on a surface opposite to the light-emitting diode substrate.

7. A display device comprising a display panel; and the surface-emitting device according to claim 1 placed on a rear surface of the display panel.

* * * * *